(12) United States Patent
Yasui et al.

(10) Patent No.: US 8,574,676 B2
(45) Date of Patent: Nov. 5, 2013

(54) SUBSTRATE PROCESSING METHOD

(75) Inventors: Kanji Yasui, Niigata (JP); Hiroshi Nishiyama, Niigata (JP); Yasunobu Inoue, Niigata (JP); Mitsuru Ushijima, Tokyo (JP); Katsuhiko Iwabuchi, Kanagawa (JP)

(73) Assignees: National University Corporation Nagaoka University of Technology, Niigata (JP); Tokyo Electron Limited, Tokyo (JP)

( * ) Notice: Subject to any disclaimer, the term of this patent is extended or adjusted under 35 U.S.C. 154(b) by 100 days.

(21) Appl. No.: 13/130,066

(22) PCT Filed: Nov. 19, 2009

(86) PCT No.: PCT/JP2009/069619
§ 371 (c)(1),
(2), (4) Date: Jun. 13, 2011

(87) PCT Pub. No.: WO2010/058813
PCT Pub. Date: May 27, 2010

(65) Prior Publication Data
US 2011/0229637 A1 Sep. 22, 2011

(30) Foreign Application Priority Data

Nov. 21, 2008 (JP) .................................. 2008-297906

(51) Int. Cl.
*C23C 16/40* (2006.01)
(52) U.S. Cl.
USPC ................................. 427/255.31; 427/255.33
(58) Field of Classification Search
USPC ........................................ 427/255.31, 255.33
See application file for complete search history.

(56) References Cited

U.S. PATENT DOCUMENTS

| | | |
|---|---|---|
| 2001/0010975 A1 | 8/2001 | Tanabe et al. |
| 2002/0136831 A1 | 9/2002 | Gronet et al. |
| 2005/0252449 A1* | 11/2005 | Nguyen et al. ................. 118/715 |
| 2005/0271812 A1* | 12/2005 | Myo et al. .................. 427/248.1 |
| 2007/0065578 A1* | 3/2007 | McDougall ................ 427/248.1 |
| 2008/0032044 A1* | 2/2008 | Kuriyagawa et al. .... 427/255.33 |

FOREIGN PATENT DOCUMENTS

| | | |
|---|---|---|
| JP | 06-128743 | 5/1994 |
| JP | 2000-281495 | 10/2000 |
| JP | 2002-324792 | 11/2002 |
| JP | 2004-221606 | * 8/2004 |
| JP | 2004-244716 | 9/2004 |
| JP | 2008-283147 | 11/2008 |

OTHER PUBLICATIONS

Freund, Hans-Joachim, et al., "Metal-supported ultrathin oxide film systems as designable catalysts and catalyst supports". Surface Science 601 (2007) 1438-1442.*
Yegiazarov, Yu.G., et al., "Fibrous catalyst for oxidation of hydrogen with oxygen". Reactive & Functional Polymers 44 (2000) 145-152.*
Kudo, Akihiko, et al., "Photoactivity of Ternary Lead-Group IVB Oxides for Hydrogen and Oxygen Evolution". Catalysis Letters 5 (1990) 61-66.*
International Search Report mailed on Feb. 23, 2010, no page numbers.

* cited by examiner

*Primary Examiner* — Bret Chen
(74) *Attorney, Agent, or Firm* — IPUSA, PLLC

(57) ABSTRACT

A substrate processing method includes steps of: arranging a substrate in a chamber; introducing $H_2$ gas at a first flow rate and $O_2$ gas at a second flow rate independently from the $H_2$ gas into a catalyst reaction portion in which catalyst is accommodated, wherein $H_2O$ gas produced from the $H_2$ gas and the $O_2$ gas that contact the catalyst is ejected from the catalyst reaction portion toward the substrate; and reducing a flow rate of the $O_2$ gas introduced to the catalyst reaction portion to a third flow rate that is lower than the second flow rate, wherein the steps of introducing the $H_2$ gas and the $O_2$ gas and reducing the flow rate of the $O_2$ gas are repeated in this order at a predetermined repetition frequency, thereby processing the substrate.

18 Claims, 34 Drawing Sheets

301  302

303

301

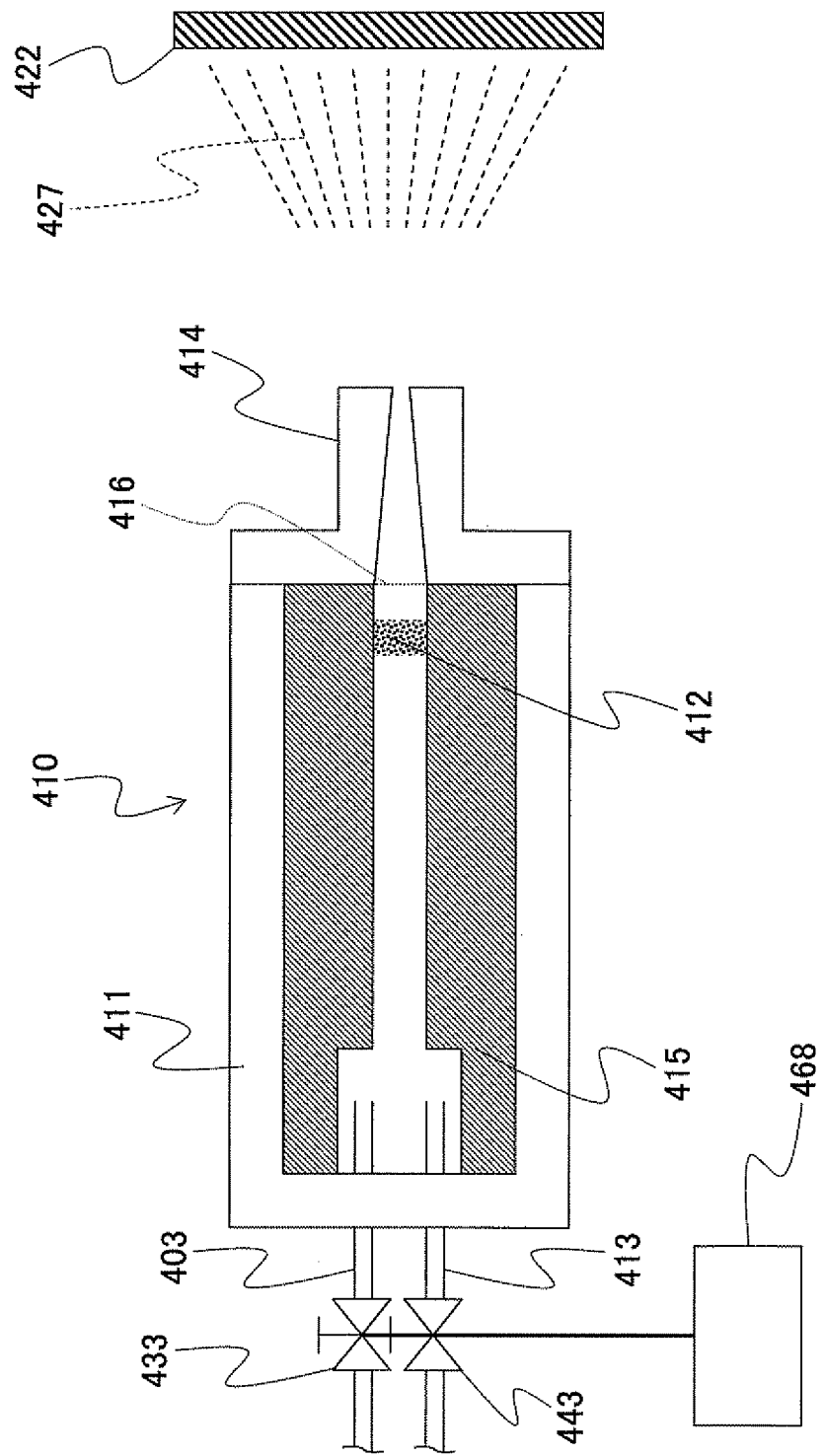

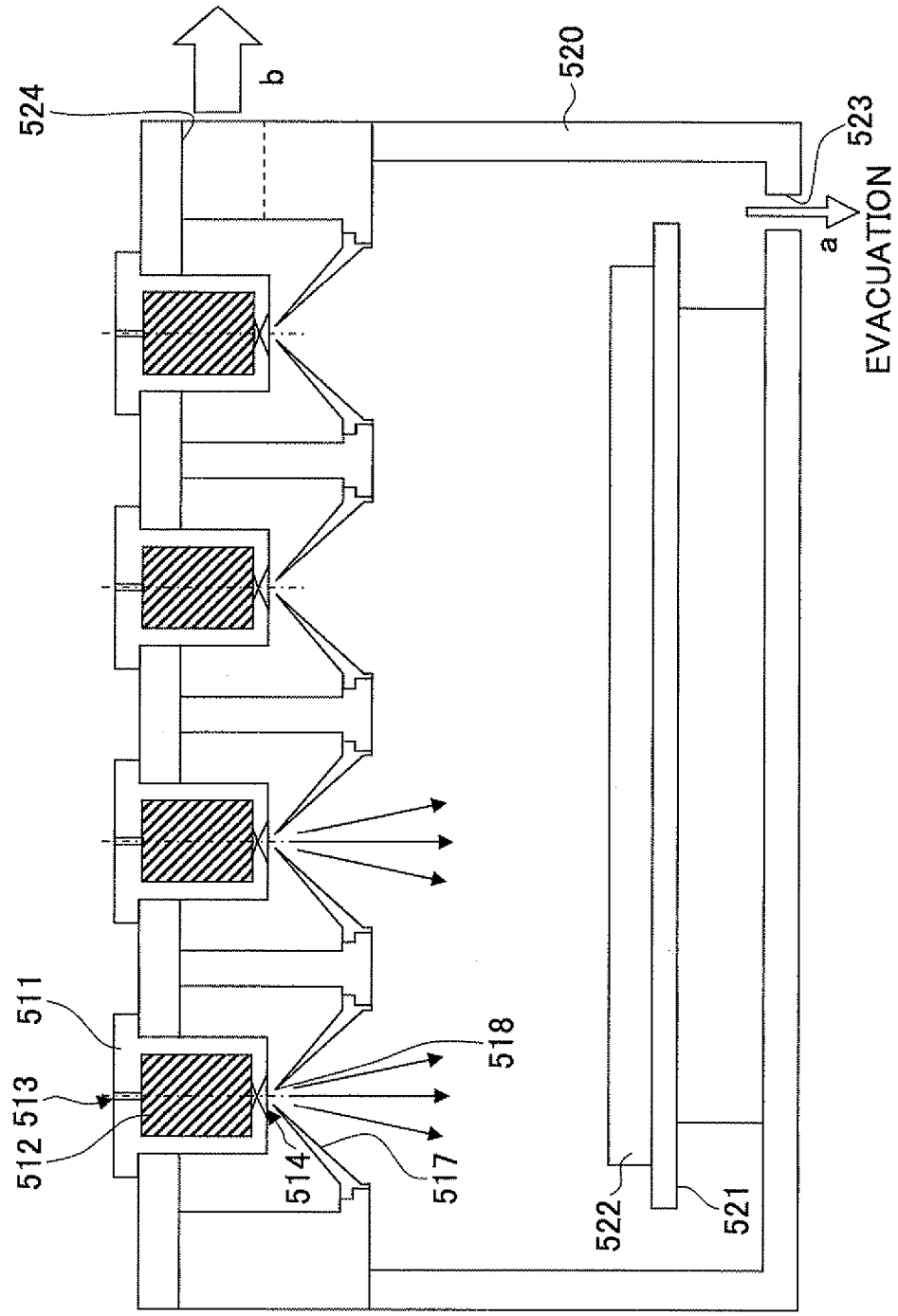

SUBSTRATE PROCESSING METHOD

TECHNICAL FIELD

The present invention relates to a substrate processing method and a substrate processing apparatus.

BACKGROUND ART

As a substrate processing method, there has been known a method for forming a metal oxide thin film such as zinc oxide and titanium oxide on surfaces of various substrates. Specifically, there can be cited a pulse laser deposition (PLD) method, a laser ablation method, a sputtering method, and various CVD methods, which are described in Patent Documents 1 through 3.

In these film deposition methods, a film is deposited by irradiating a laser beam to a surface of a target prepared in advance, causing high speed particles or the like to bombard the surface of the target to thereby deposit so-produced target particles on the surface of the substrate, or causing a metal organic compound or the like along with a reaction gas to contact the surface of the substrate that has been heated to a high temperature to thereby deposit a film through a thermal decomposition caused on the surface of the substrate.

In addition, in a semiconductor fabrication process, substrate processes such as removal of organic substances, film property improvement, oxygen implantation into an oxide film with deficient oxygen, surface oxidization of a silicon substrate, and the like are required.

Patent Document 1: Japanese Patent Application Laid-Open Publication No 2004-244716.
Patent Document 2: Japanese Patent Application Laid-Open Publication No. 2000-281495.
Patent Document 3: Japanese Patent Application Laid-Open Publication No. H6-128743.

SUMMARY OF INVENTION

Problems to be Solved by the Invention

A large amount of energy is needed in the film deposition methods described in Patent Documents 1 through 3, and thus production cost is increased, especially when a film is uniformly deposited on a large-area substrate.

In addition, the above-mentioned substrate processes require apparatuses where corresponding substrate processes are carried out, and thus the apparatuses tend to be expensive, especially when the large-area substrate is processed.

The present invention has been made in view of the above, and provides a substrate processing method and a substrate processing apparatus that are capable of efficiently processing a surface of a substrate at low cost by utilizing chemical energy accompanied with a catalyst reaction. In addition, there are provided a film deposition method serving as a substrate processing method and a film deposition apparatus serving as a substrate processing apparatus, which are capable of efficiently forming a film of a compound such as a metal oxide or the like at low cost.

Means of Solving the Problems

A first aspect of the present invention provides a substrate processing method of processing a substrate, the method comprising steps of: arranging a substrate in a chamber; introducing $H_2$ gas at a first flow rate and $O_2$ gas at a second flow rate independently from the $H_2$ gas into a catalyst reaction portion in which a catalyst is accommodated, wherein $H_2O$ gas produced from the $H_2$ gas and the $O_2$ gas that contact the catalyst is ejected from the catalyst reaction portion toward the substrate; and reducing a flow rate of the $O_2$ gas introduced to the catalyst reaction portion to a third flow rate that is lower than the second flow rate, wherein the steps of introducing the $H_2$ gas and the $O_2$ gas and reducing the flow rate of the $O_2$ gas are repeated in this order at a predetermined repetition frequency, thereby processing the substrate.

A second aspect of the present invention provides a substrate processing apparatus comprising: a substrate supporting portion that is provided in a chamber and supports a substrate; a catalyst reaction portion to which $H_2$ gas and $O_2$ gas are independently introduced and that ejects $H_2O$ gas produced through contact of the $H_2$ gas and the $O_2$ gas with a catalyst into the chamber; a $H_2$ gas control valve that is provided corresponding to the $H_2$ gas and controls introduction or supply of the $H_2$ gas; an $O_2$ gas control valve that is provided corresponding to the $O_2$ gas and controls introduction or supply of the $O_2$ gas; and a control portion that controls the $H_2$ gas control valve and the $O_2$ gas control valve.

BRIEF DESCRIPTION OF THE DRAWINGS

FIG. 30 is an explanatory view for explaining a substrate processing apparatus to be used in an altered example 1 according to the second embodiment.

FIG. 31 is a configuration diagram of a substrate processing apparatus to be used in an altered example 2 according to the second embodiment.

MODE(S) FOR CARRYING OUT THE INVENTION

According to an embodiment of the present invention, there are provided a substrate processing method and a substrate processing apparatus that are capable of efficiently processing a surface of a substrate at low cost by utilizing chemical energy accompanied with a catalyst reaction. In addition, there are provided a film deposition method serving as a substrate processing method and a film deposition apparatus serving as a substrate processing apparatus, which are capable of efficiently forming a film of a compound such as a metal oxide or the like at low cost.

A preferable embodiment for practicing the present invention will be explained in the following.

First Embodiment

Figure 1:
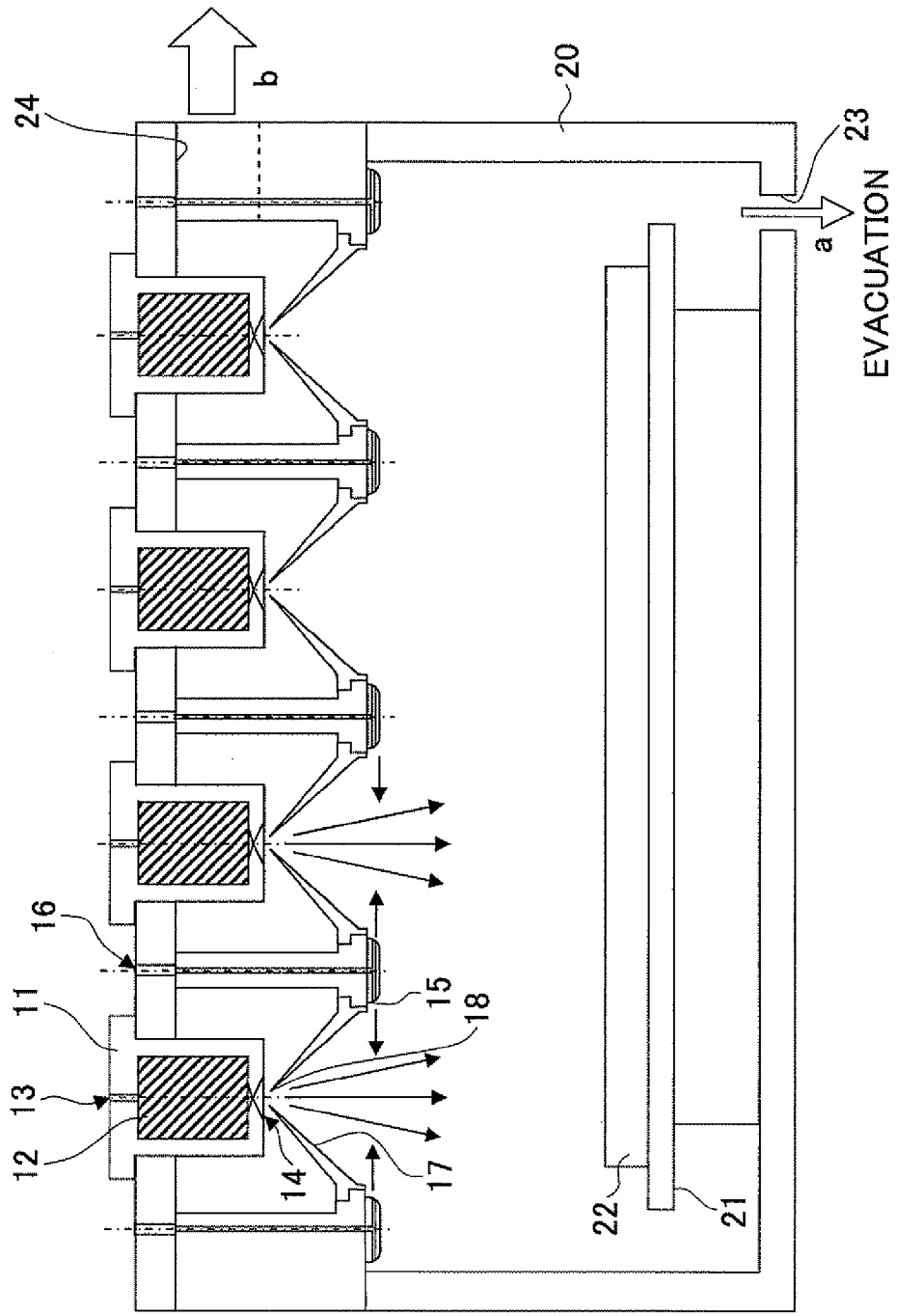
FIG. 1 is a cross-sectional view of a film deposition apparatus of a first embodiment.
Figure 2:
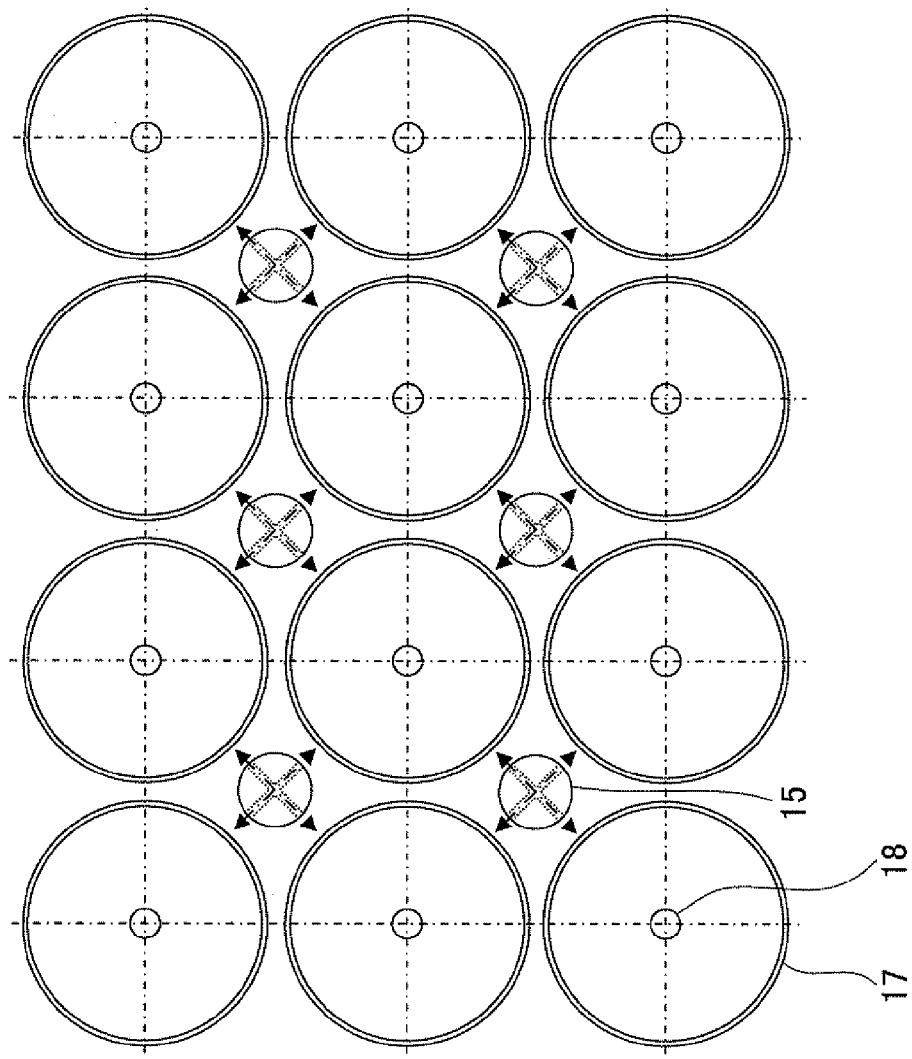
FIG. 2 is an inner plan view of the film deposition apparatus of the first embodiment.

Referring to FIG. 1 and FIG. 2, a film deposition apparatus according to a first embodiment of the present invention is explained. FIG. 1 is a cross-sectional view of the film deposition apparatus according to this embodiment, and FIG. 2 is a partial plan view of a portion of the film deposition apparatus, to which a reaction gas and a deposition gas are supplied.

The film deposition apparatus in this embodiment is an apparatus where a film deposition is carried out with respect to, for example, a substrate for a display panel, a semiconductor wafer, and the like, and that is provided with plural catalyst reaction containers 11 serving as a catalyst reaction portion. A mixed gas of $H_2$ gas and $O_2$ gas is supplied to the catalyst reaction containers 11, each of which is provided in its inside with a catalyst 12, from corresponding gas inlets 13. With the mixed gas of the $H_2$ gas and the $O_2$ gas introduced into the catalyst reaction containers 11, a chemical reaction producing a large amount of heat is caused by the catalyst 12 in the catalyst reaction containers 11, thereby a producing high temperature $H_2O$ gas. On the other sides of the corresponding catalyst reaction containers 11 across the gas inlets 13 with respect to the catalysts 12, there are provided ejection holes 14, from which the high temperature $H_2O$ gas produced by the catalyst 12, is vigorously ejected into a chamber 20. The ejection holes 14 have a funnel shape, namely a shape whose aperture becomes larger toward the distal end thereof. Incidentally, a substrate 22 is arranged on a stage 21 in the chamber 20, and the high temperature $H_2O$ gas is ejected toward the substrate 22.

On the other hand, deposition gas nozzles 15 are provided between the catalyst reaction containers 11, and a deposition gas composed of a metal organic compound such as DMZ ($Zn(CH_3)_2$) or the like is introduced from deposition gas inlets 16 of the deposition gas nozzles 15, and thus supplied from distal ends of the deposition gas nozzles 15. In this embodiment, the deposition gas composed of the metal organic compound is supplied from the distal end of the deposition gas nozzle 15 in such a manner that an ejection direction of the deposition gas is transverse or substantially perpendicular to an ejection direction of the high temperature $H_2O$ gas ejected from the ejection hole 14 of the catalyst reaction container 11. Incidentally, the chamber 20 is evacuated by a vacuum pump (not shown) through an evacuation opening 23, as shown by an arrow a.

In the film deposition apparatus according to this embodiment, there are provided section walls 17, each of which has a cone (funnel) shape that is open at the distal end, so that high temperature $H_2O$ gas having high energy, which is part of the high temperature $H_2O$ gas ejected from the ejection holes 14, is supplied into the chamber 20, and thus, the high temperature $H_2O$ gas having high energy is selectively supplied from openings 18 of the selection walls 17 toward the substrate 22 arranged on the stage 21. Incidentally, the distal ends of the deposition gas nozzles 15 are at the same height as outer circumferences of the selection walls 17.

The high temperature $H_2O$ gas having low energy that has been filtered out by the selection walls 17 is evacuated in a direction indicated by an arrow b through an evacuation port 24 provided on a side wall of the catalyst reaction container 11 by a vacuum pump (not shown).

Plural units, each of which is composed of one of the catalyst reaction containers 11 and one of the funnel-shaped selection walls 17, are two-dimensionally arrayed in the film deposition apparatus according to this embodiment. One of the units may be surrounded by four other nearest neighbor units. In addition, the deposition gas nozzle 15 and the deposition gas inlet 16 are arranged in the center of a square having a minimum area obtained by connecting centers of corresponding four nearest neighbor units (in other words, a square having the minimum area among squares obtained by connecting the centers of the four squares).

In this embodiment, there can be used as the catalyst 12 a carrier in the form of microparticles having an average particle diameter of 0.05 mm through 2.0 mm, which carries a catalyst component in the form of ultra-microparticles having an average particle diameter of 1 nm through 10 nm, and metal powder or microparticles of metal such as platinum (Pt), ruthenium (Ru), iridium (Ir), copper (Cu) or the like having an average particle diameter of 1 mm through 0.5 mm. As the carrier, microparticles of metal oxides such as aluminum oxide, zirconium oxide and zinc oxide, that is, microparticles of ceramic oxides may be used. As a preferable carrier, there may be a aluminum oxide carrier carrying nanoparticles of platinum, a carrier obtained by subjecting porous γ-alumina to a thermal process at 500° C. through 1200° C. to transform the porous γ-alumina into an α-alumina crystal phase while maintaining the surface structure thereof, the carrier carrying platinum of 1 through 20 wt. % (for example, 10 wt. % Pt/γ-$Al_2O_3$ catalyst), and the like.

As the oxide films deposited on the surface of the substrate, there may be metal oxide films such as titanium oxide, zinc oxide, magnesium oxide, yttrium oxide, sapphire, Sn:$In_2O_3$ (Indium Tin Oxide: ITO).

The deposition gas composed of the metal organic compound gas required for forming the metal oxide film is not limited, but may be any metal organic compound that is used when depositing a metal oxide in a conventional CVD method. As such a metal organic compound, there may be, for example but not limited to, an alkyl compound, an alkenyl compound, a phenyl compound, an alkyl phenyl compound, an alkoxide compound, a di-pivaloyl methane compound, a halogen compound, an acetylacetonate compound, an EDTA compound, or the like of various metals. Incidentally, the source material of the metal oxide thin film may be an inorganic metal compound gas such as a halogen compound, except for the metal organic compound gas. Specifically, zinc chloride ($ZnCl_2$) or the like is cited.

As a preferable metal organic compound, there may be, for example but not limited to, an alkyl compound and alkoxide compound of various metals. Specifically, dimethyl zinc, diethyl zinc, trimethyl aluminum, triethyl aluminum, trimethyl indium, triethyl indium, trimethyl gallium, triethyl gallium, triethoxy aluminum or the like may be pointed out.

When the zinc oxide film is deposited on the surface of the substrate, the dialkyl zinc such as dimethyl zinc and diethyl zinc is preferably used as the source material, and alumina in the form of microparticles carrying platinum ultra-microparticles is preferably used as the catalyst.

As the substrate, one selected from metal, metal oxide, glass, ceramic materials, semiconductors, and plastic materials may be used.

In this embodiment, the $H_2O$ gas having high energy is produced by introducing the mixed gas of the $H_2$ gas and the $O_2$ gas serving as an oxygen source into the catalyst reaction containers 11 from the corresponding gas inlets 13 thereby causing the mixed gas to contact the catalyst 12. The produced $H_2O$ gas having high energy is ejected from the distal ends of the catalyst reaction containers 11 and caused to react with the deposition gas in a gaseous phase, so that the metal oxide produced through the reaction is deposited on the substrate. Because the high temperature $H_2O$ gas having high energy is produced through the catalyst reaction between the mixed gas of the $H_2$ gas and the $O_2$ gas, or the $H_2O$ gas, and the catalyst 12, there is no need for decomposing the mixed gas of the $H_2$ gas and the $O_2$ gas, or the $H_2O$ gas by heating the substrate, which can eliminate the need for a large amount of electric energy. Therefore, the metal oxide film can be efficiently formed at low cost. Such a chemical reaction accompanied with a large amount of heat can be realized by selecting a specific gas serving as the oxygen source and using the catalyst 12.

Incidentally, the carrier may have a shape having many pores such as a sponge form, a bulk shape including a honeycomb form having penetrating holes, or the like. In addition, the shape or form of the catalyst material, such as platinum, ruthenium, iridium and copper, is not limited to the microparticle form, but may be a film form, for example. Specifically, a surface area of the catalyst material is preferably large in order to certainly obtain the effects of this embodiment. Therefore, when the film of the catalyst material is formed on the above carriers, for example, the effects similar to those obtainable in the case of the microparticle form can also be obtained because the surface area of the catalyst material can be enlarged.

In the film deposition apparatus according to this embodiment, because there is no need for heating the substrate to higher temperatures, a high quality hetero-epitaxial film can be formed on the substrate even at a low temperature of 400° C. or lower, at which temperature a high quality film is not realized by a conventional thermal CVD method. Therefore, semiconductor materials, electronic materials, and the like can be produced in a large area at low cost using a substrate that used to be difficult to use.

Next, another film deposition apparatus according to an embodiment of the present invention is explained with reference to FIG. 3 through FIG. 7. The film deposition apparatus below is configured by altering a part of the film deposition apparatus shown in FIGS. 1 and 2.

Figure 3:
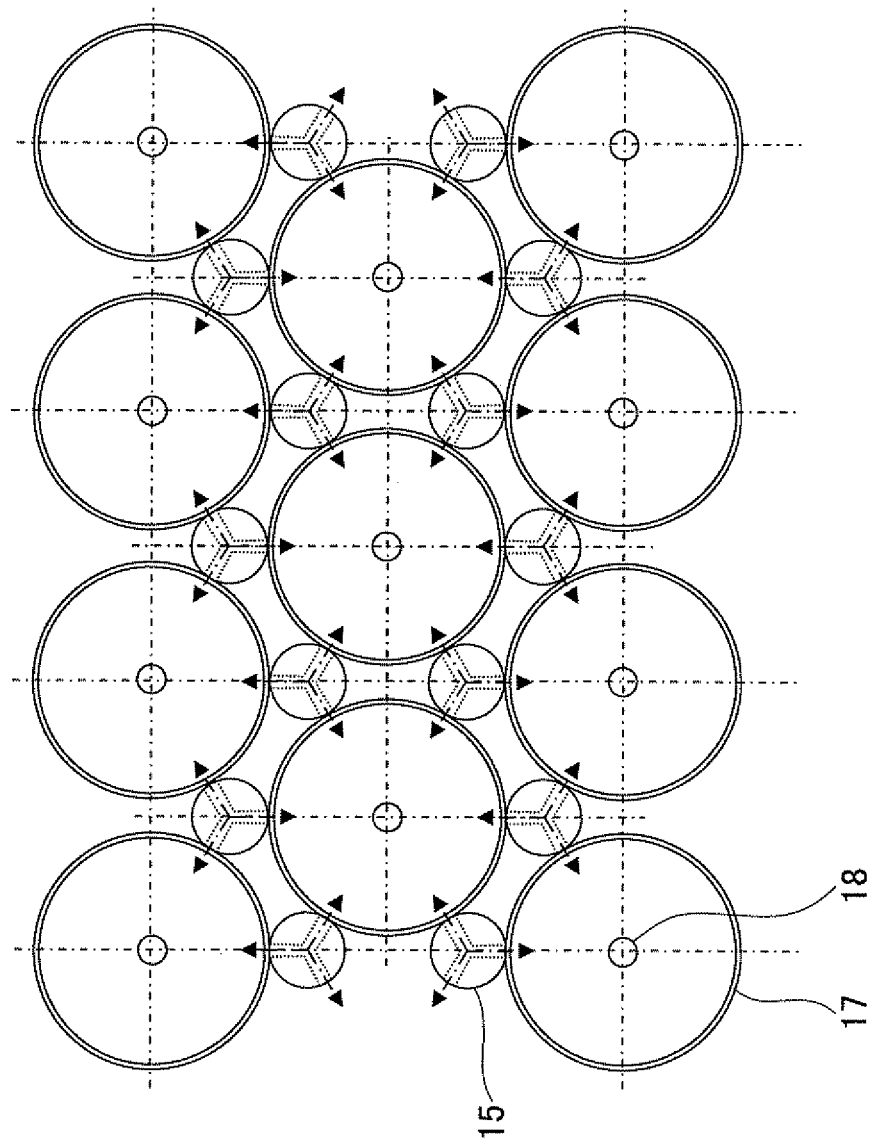
FIG. 3 is an inner plan view of another film deposition apparatus of the first embodiment (Part 1).

Referring to FIG. 3, the film deposition apparatus according to this altered example, plural units, each of which is composed of one catalyst reaction container 11 and a funnel-shaped selection wall 17, are two-dimensionally arranged. One of the units may be surrounded by six nearest neighbor units, and the deposition gas nozzles 15 are arranged in the center of a triangle having a minimum area obtained by connecting centers of the corresponding three nearest neighbor units (in other words, a triangle having the minimum area among triangles obtained by connecting the centers of the three units).

Figure 4:
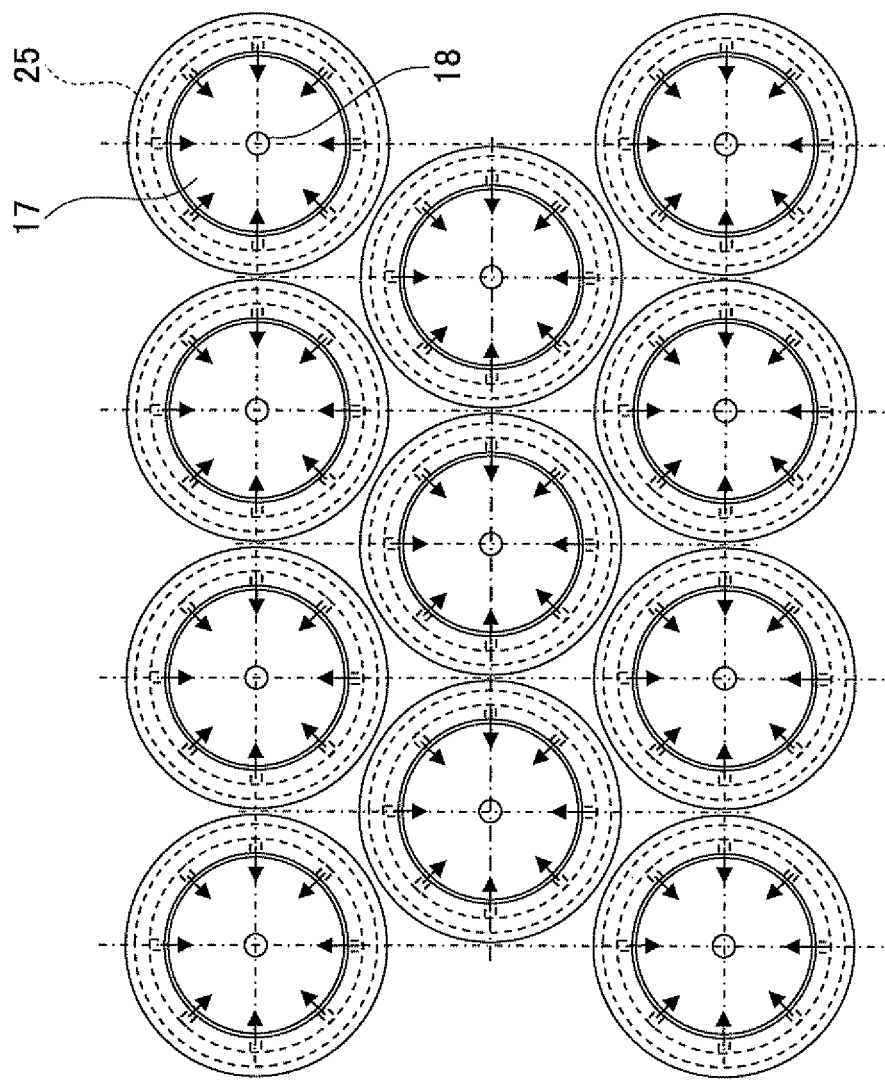
FIG. 4 is an inner plan view of another film deposition apparatus of the first embodiment (Part 2).

Referring to FIG. 4, this film deposition apparatus of this example is provided with deposition gas nozzles 25, each of which has a circular shape in order to surround the unit composed of the catalyst reaction container 11 and the funnel-shaped selection wall 17.

Figure 5:
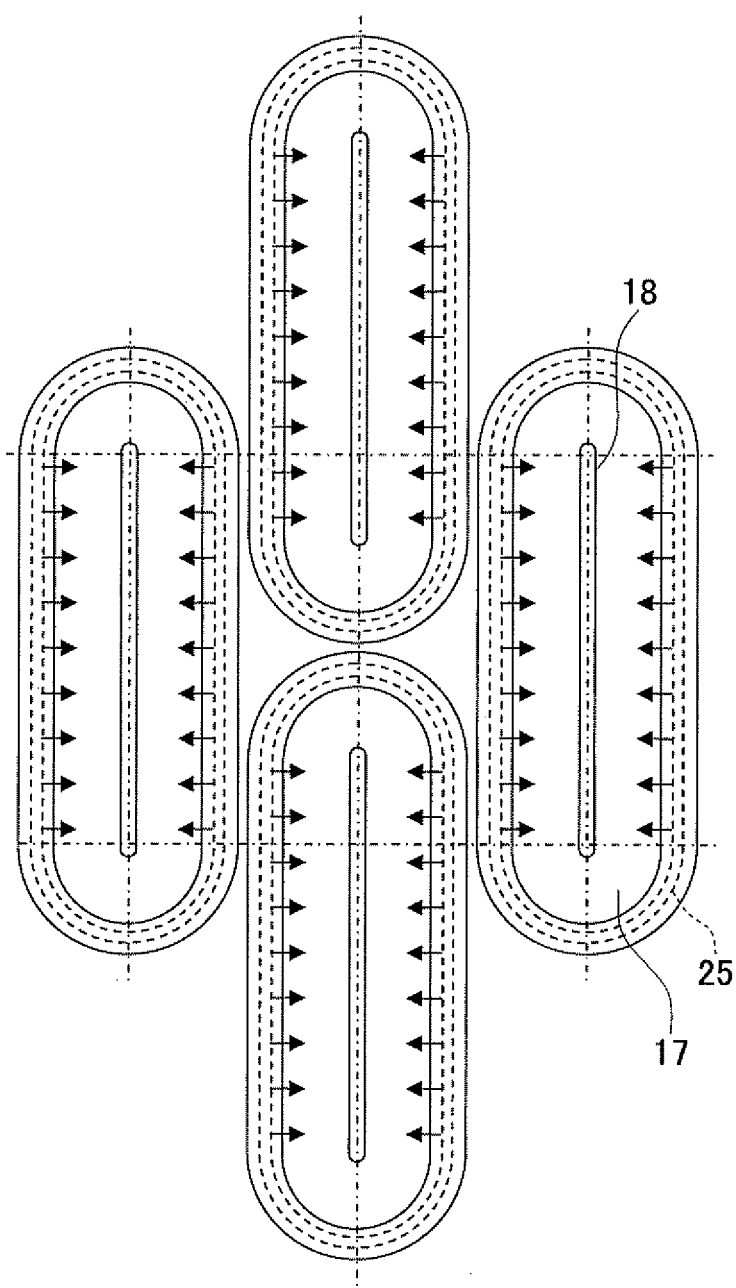
FIG. 5 is an inner plan view of another film deposition apparatus of the first embodiment (Part 3).

Referring to FIG. 5, this film deposition apparatus of this example is provided with openings 18, each of which has an oval shape, selection walls 17, each of which has an oval cone shape, and deposition gas nozzles 25, each of which has an oval shape and surrounds the selection wall 17.

Figure 6:
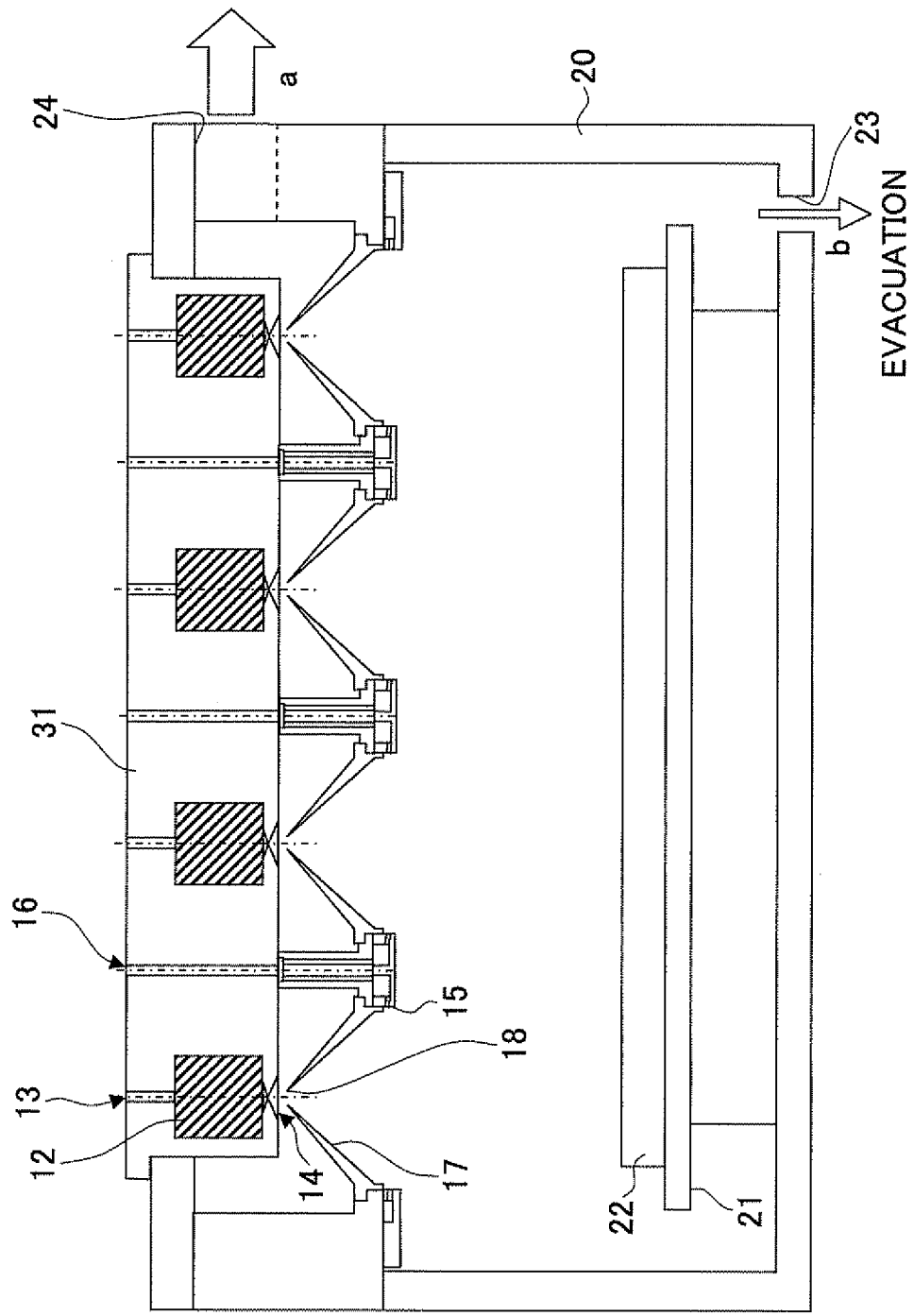
FIG. 6 is an inner plan view of another film deposition apparatus of the first embodiment (Part 1).

Referring to FIG. 6, a catalyst reaction container 31 is integrally provided in this film deposition apparatus of this example. Namely, the catalyst reaction container 31 includes areas where the catalysts 12 are provided, gas inlets 13 that introduce the mixed gas of the $H_2$ gas and the $O_2$ gas into the corresponding areas, and ejection holes 14 that eject the $H_2O$ gas having high energy from the corresponding areas.

Figure 7:
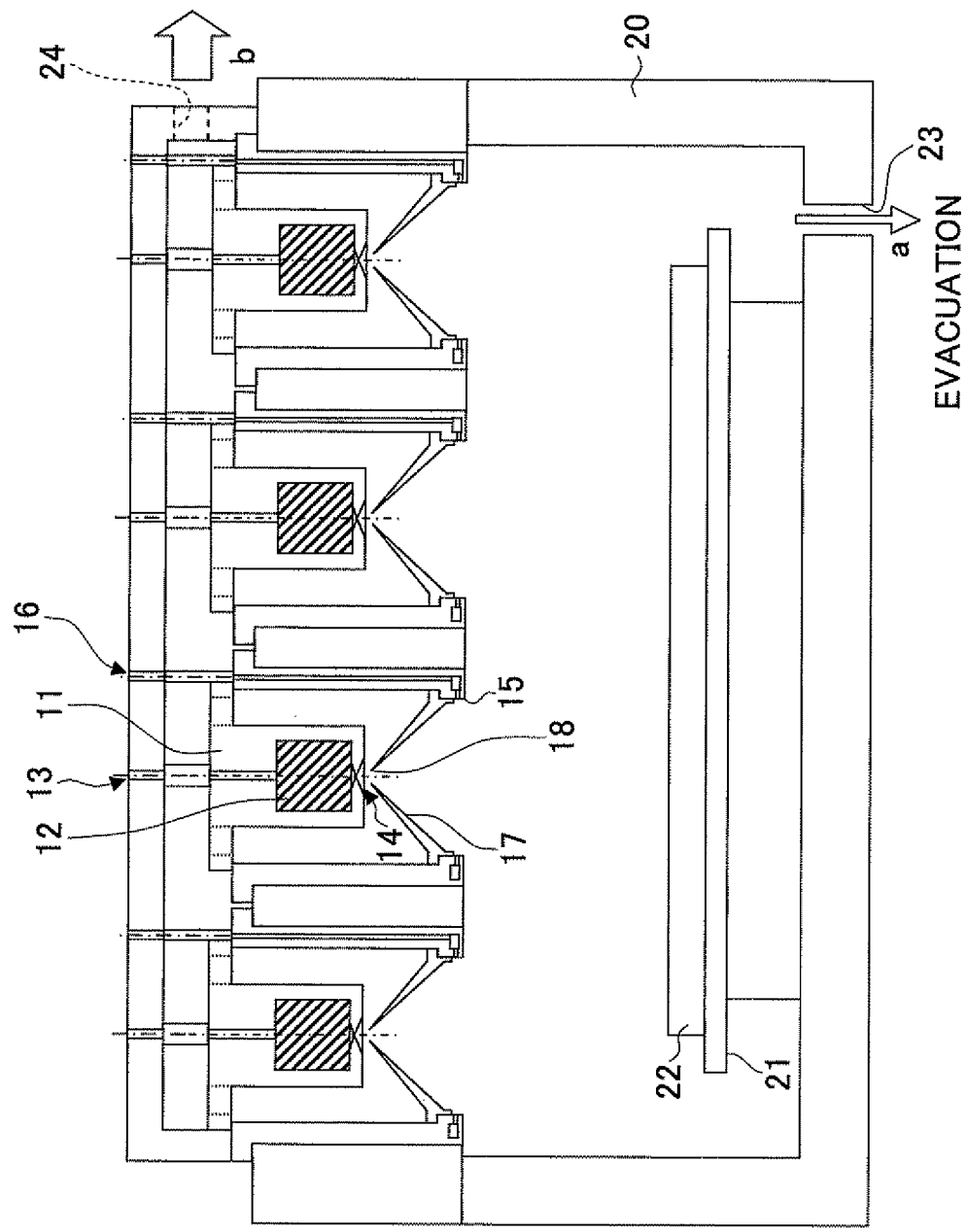
FIG. 7 is an inner plan view of another film deposition apparatus of the first embodiment (Part 2).

Referring to FIG. 7, a catalyst reaction container 11 is configured as a changeable unit in a film deposition apparatus of another example. Namely, each of the catalyst reaction containers 11 is accommodated as the changeable unit in a chamber 20. Therefore, the catalyst reaction container 11 where the catalyst 12 that has come to be unable to provide a predetermined performance can be replaced with another of the catalyst reaction container 11 where an unused one of the catalysts 12 is accommodated.

Next, a film deposition apparatus of yet another altered example of this embodiment, where the $H_2$ gas and the $O_2$ gas are separately supplied, is explained with reference to FIG. 8.

Figure 8:
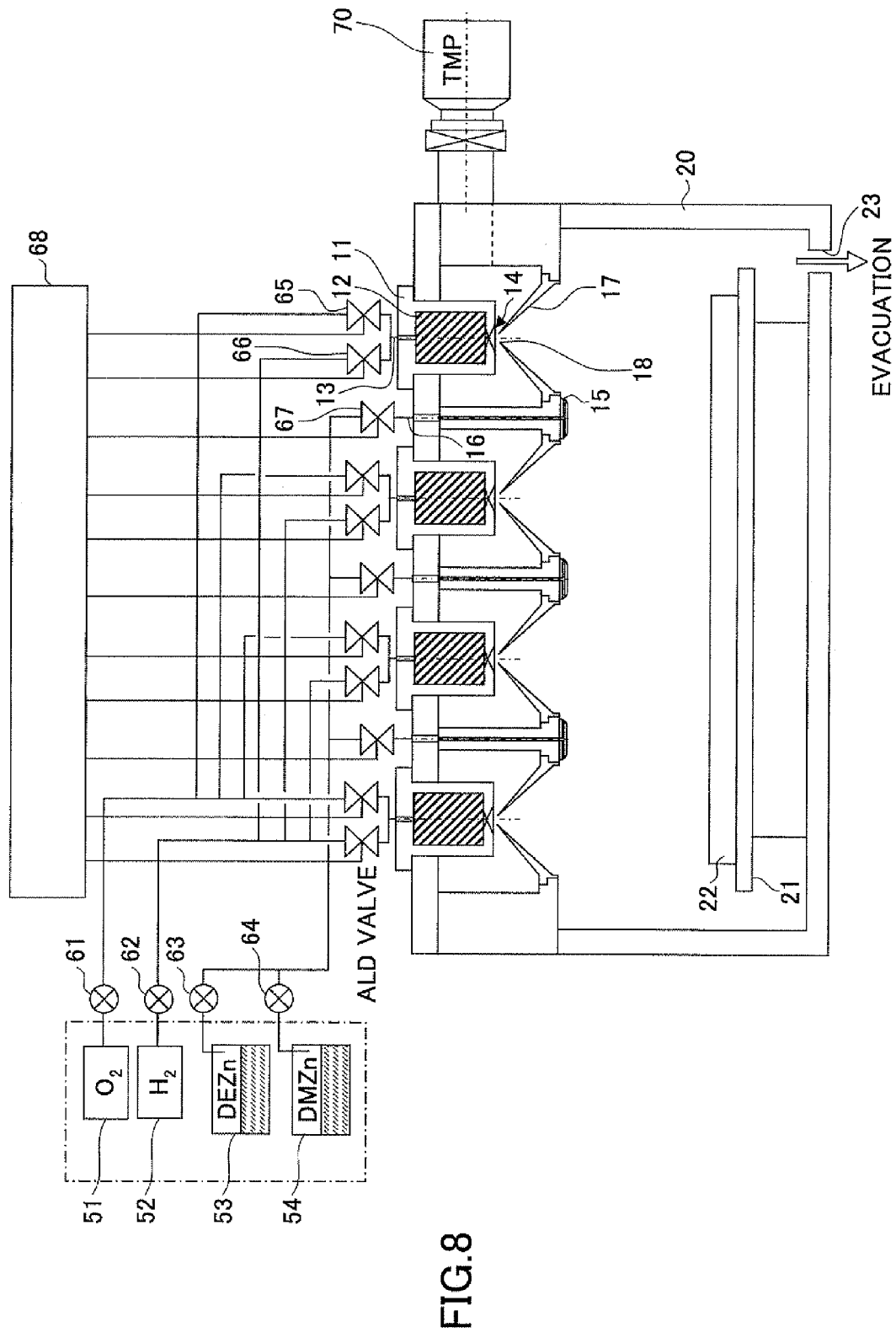
FIG. 8 is an inner plan view of another film deposition apparatus of the first embodiment (Part 1).

As shown in FIG. 8, the $H_2$ gas and the $O_2$ gas are introduced into the gas inlets 13 and mixed in the corresponding catalyst reaction containers 11. Specifically, this film deposition apparatus is provided with an $O_2$ gas cylinder 51 and an $H_2$ gas cylinder 52 that supply source gases, and a DEZ ($Zn(C_2H_5)_2$) cylinder 53, DMZ ($Zn(CH_3)_2$) cylinder 54 that supply deposition gases. The cylinders 51, 52, 53, 54 are provided with open/close valves 61, 62, 63, 64, respectively. By opening the open/close valves 61, 62, 63, 64, the corresponding gases are supplied from the corresponding cylinders. In addition, the gas inlets 13 and gas inlets 16 are provided with control valves 65, 66, 67 that control supplying the gases, respectively. Moreover, the film deposition apparatus is provided with a control portion 68 that controls opening/closing the control valves 65, 66, 67 and flow rates of the gases.

The $O_2$ gas is supplied to the gas inlets 13 provided in the corresponding catalyst reaction containers 11 from the $O_2$ gas cylinder 51 through the corresponding control valves 65. In addition, the $H_2$ gas is supplied to gas inlets 13 provided in the corresponding catalyst reaction containers 11 from the $H_2$ gas cylinder 52 through the corresponding control valves 66. The control valves 65, 66 are electromagnetically controlled by the control portion 68. By controlling each of the control valves 65, 66, the $H_2$ gas and the $O_2$ gas can be supplied intermittently or at different partial pressures.

In addition, the DEZ and the DMZ as the deposition gas are selectively supplied into the chamber 20 by opening one of the open/close valve 63 connected to the DEZ cylinder 53 and the open/close valve 64 connected to the DMZ cylinder 54. The selected deposition gas is supplied through the corresponding one of the control valves 67 that are provided in front stages of the corresponding deposition gas inlets 16. The control valves 67 are electromagnetically controlled by the control portion 68. By controlling each of the control valves 67, a flow rate and a supplying timing can be adjusted.

The $H_2$ gas and the $O_2$ gas supplied to the gas inlets 13 react with each other in the catalyst reaction containers 11, so that high temperature $H_2O$ gas is produced and ejected from the ejection holes 14. In this case, the $H_2O$ gas having low energy can be excluded by the selection walls 17, and the $H_2O$ gas having high energy is supplied through the openings 18.

The $H_2O$ gas having high energy and the deposition gas supplied from the deposition gas nozzle 15 react with each other, and a film of the reaction product is deposited on a substrate 22 placed on the stage 21.

Incidentally, the chamber 20 is evacuated by a vacuum pump (not shown) through the evacuation opening 23, as shown by an arrow a. In addition, the $H_2O$ gas having low energy, which has been excluded by the selection walls 17 is evacuated by a turbo molecular pump (TMP) 70 provided on a side face of the chamber 20.

Moreover, the control valve is not necessarily provided near the catalyst reaction container 11, but may be provided in each of the gas supplying lines.

Figure 9:
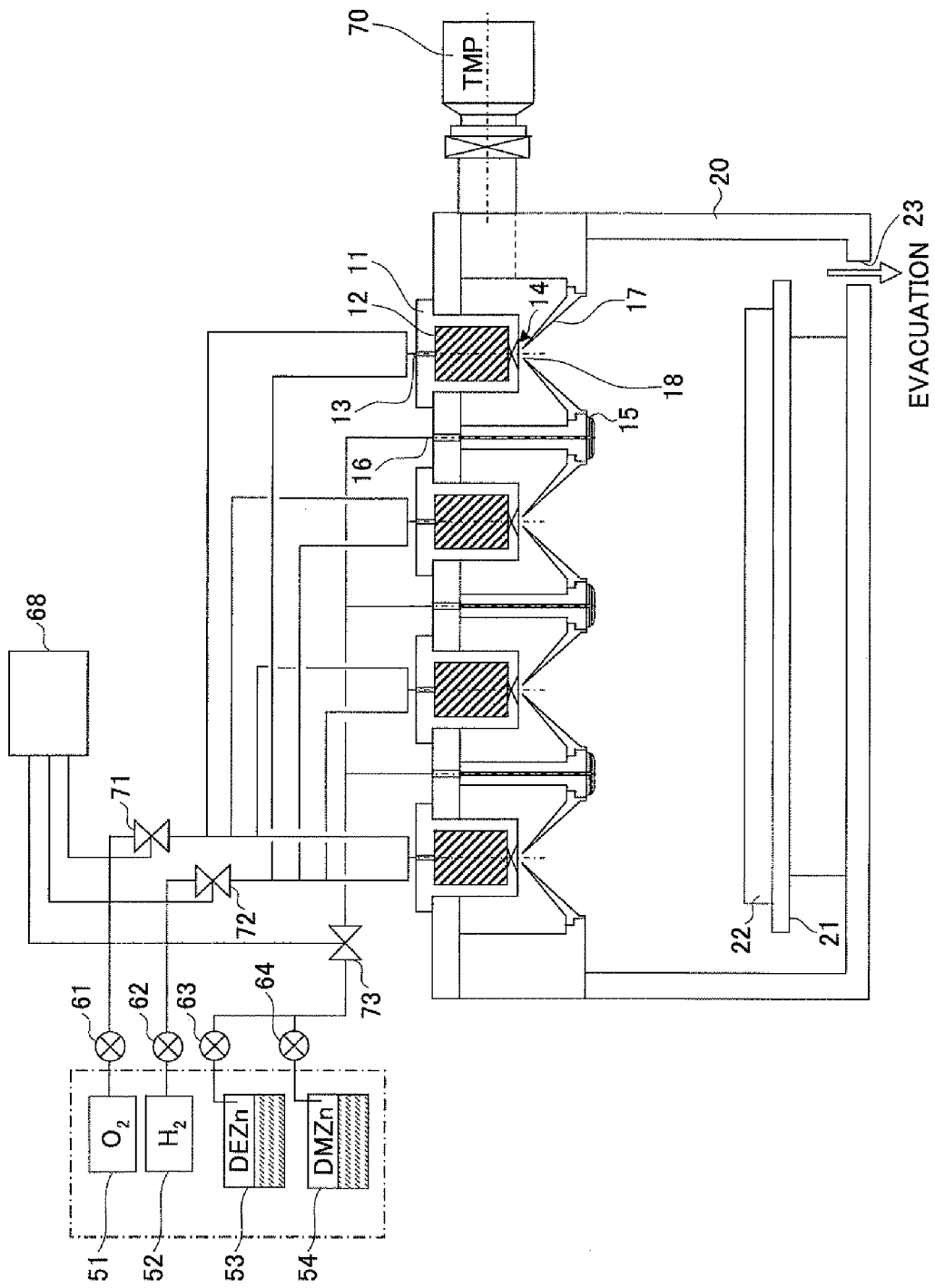
FIG. 9 is an inner plan view of another film deposition apparatus of the first embodiment (Part 2).

Specifically, in a film deposition apparatus shown in FIG. 9, the $O_2$ gas from the $O_2$ gas cylinder 51 is flow-controlled by a control valve 71 provided after the open/close valve 61 and is introduced into the inlets provided in the corresponding catalyst reaction containers 11. The $H_2$ gas from the $H_2$ gas cylinder 52 is flow-controlled by a control valve 72 provided after the open/close valve 62 and is introduced into the inlets 13 provided in the corresponding catalyst reaction containers 11.

In addition, regarding the DEZ and the DMZ as the deposition gases, one of the open/close valve 63 connected to the DEZ cylinder 53 and the open/close valve 64 connected to the DMZ cylinder 54 is opened, and the corresponding one of the deposition gases is introduced into the deposition gas inlets 16 at flow rates controlled by a control valve 73. In addition, opening/closing the control valves 71, 72, 73 and flow rates are controlled by the control portion 68.

In the film deposition apparatus of this embodiment, a transparent electric conductive film can be uniformly formed in a large area.

Altered Example 1

Next, a film deposition apparatus according to an altered example 1 of the first embodiment of the present invention is explained. In that the selection wall 17 is not provided, the film deposition apparatus of the altered example 1 is different from the film deposition apparatuses shown in FIGS. 1 through 9.

Figure 10:
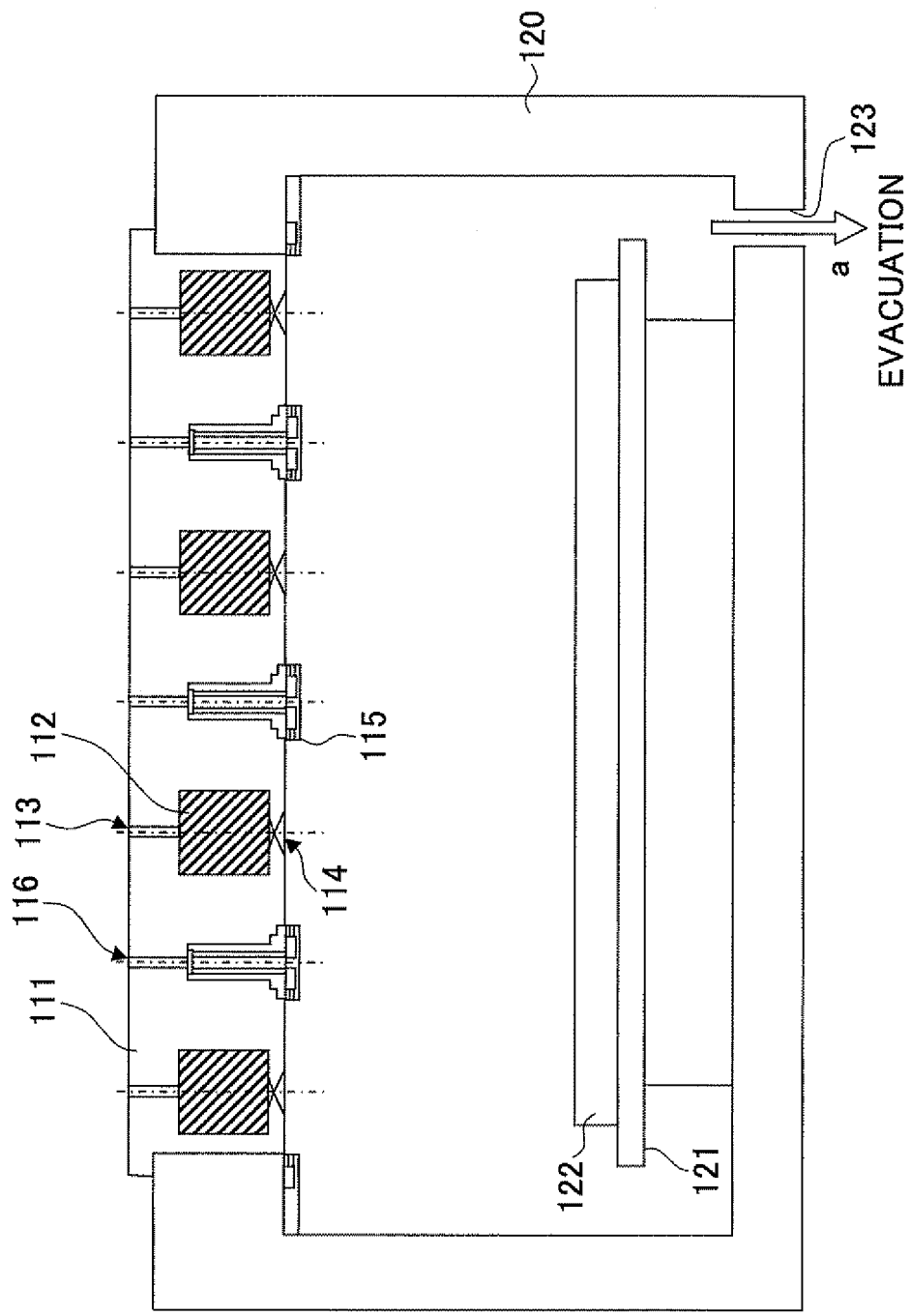
FIG. 10 is a configuration diagram of a film deposition apparatus of an altered example 1 of the first embodiment.

Referring to FIG. 10, the film deposition apparatus of this altered example is explained. The film deposition apparatus can deposit a film on a large-area substrate for a display panel or the like, and is provided with plural catalysts 112 in a catalyst reaction container 111 serving as a catalyst reaction portion. A mixed gas of the $H_2$ gas and the $O_2$ gas is supplied from gas inlets 113 to the corresponding catalysts 112. With the mixed gas of the $H_2$ gas and the $O_2$ gas that has been introduced from the gas inlets 113, a chemical reaction accompanied with a large amount of heat takes place with the catalysts 112 to thereby produce high temperature $H_2O$ gas. In addition, ejection holes 114 are provided on the other side across the corresponding gas inlets 113 with respect to the corresponding catalysts 112, and the high temperature $H_2O$ gas produced by the catalysts 112 is vigorously ejected from the ejection holes 114 to the inside of the chamber 120. Each of the ejection holes 114 has a funnel shape, namely a shape whose aperture becomes larger in the direction along which the $H_2O$ gas is ejected. In the chamber 120, a substrate 122 is arranged on a stage 121, and the $H_2O$ gas is ejected toward the substrate 122.

On the other hand, deposition gas nozzles 115 are provided between the catalysts 112, and a deposition gas composed of metal organic compound such as DMZ is introduced from deposition gas inlets 116 of the corresponding deposition gas nozzles 115, and supplied from the distal ends of the corresponding deposition gas nozzles 115. In this example, the deposition gas composed of the metal organic compound is supplied in a direction transverse or substantially perpendicular to an ejection direction of the high temperature $H_2O$ gas ejected from each of the ejection holes 114 of the catalyst reaction container 111. Incidentally, the chamber 120 is evacuated by a vacuum pump (not shown) through an evacuation opening 123, as shown by an arrow a.

Next, another film deposition apparatus in this altered example is explained.

Figure 11:
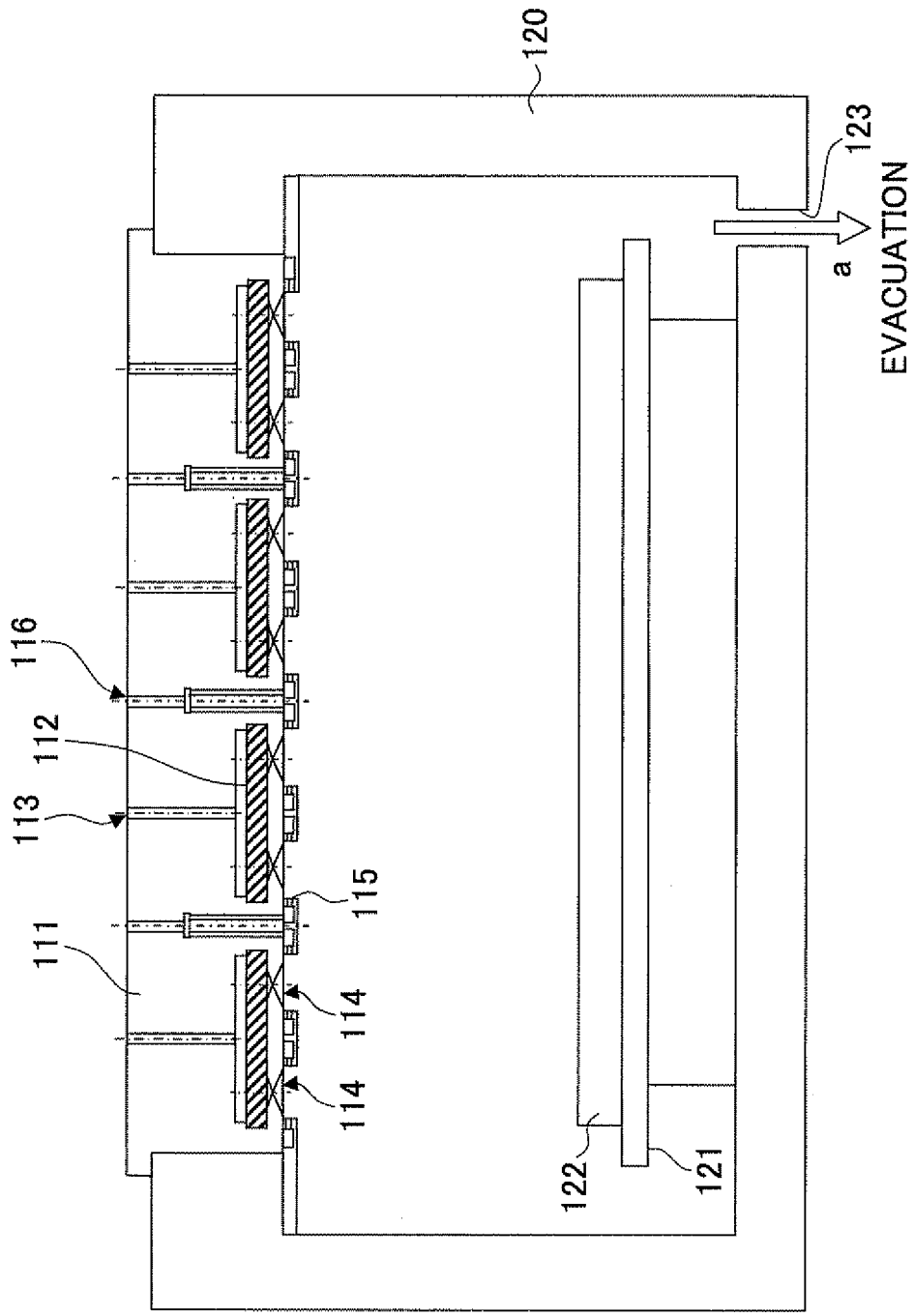
FIG. 11 is a configuration diagram of another film deposition apparatus of the altered example 1 of the first embodiment (Part 1).

A film deposition apparatus shown in FIG. 11 is provided with plural ejection holes 114 for the $H_2O$ gas to be ejected from the catalysts 112. In such a manner, by providing plural ejection holes 114, the film deposition that yields a more uniform film is possible.

Figure 12:
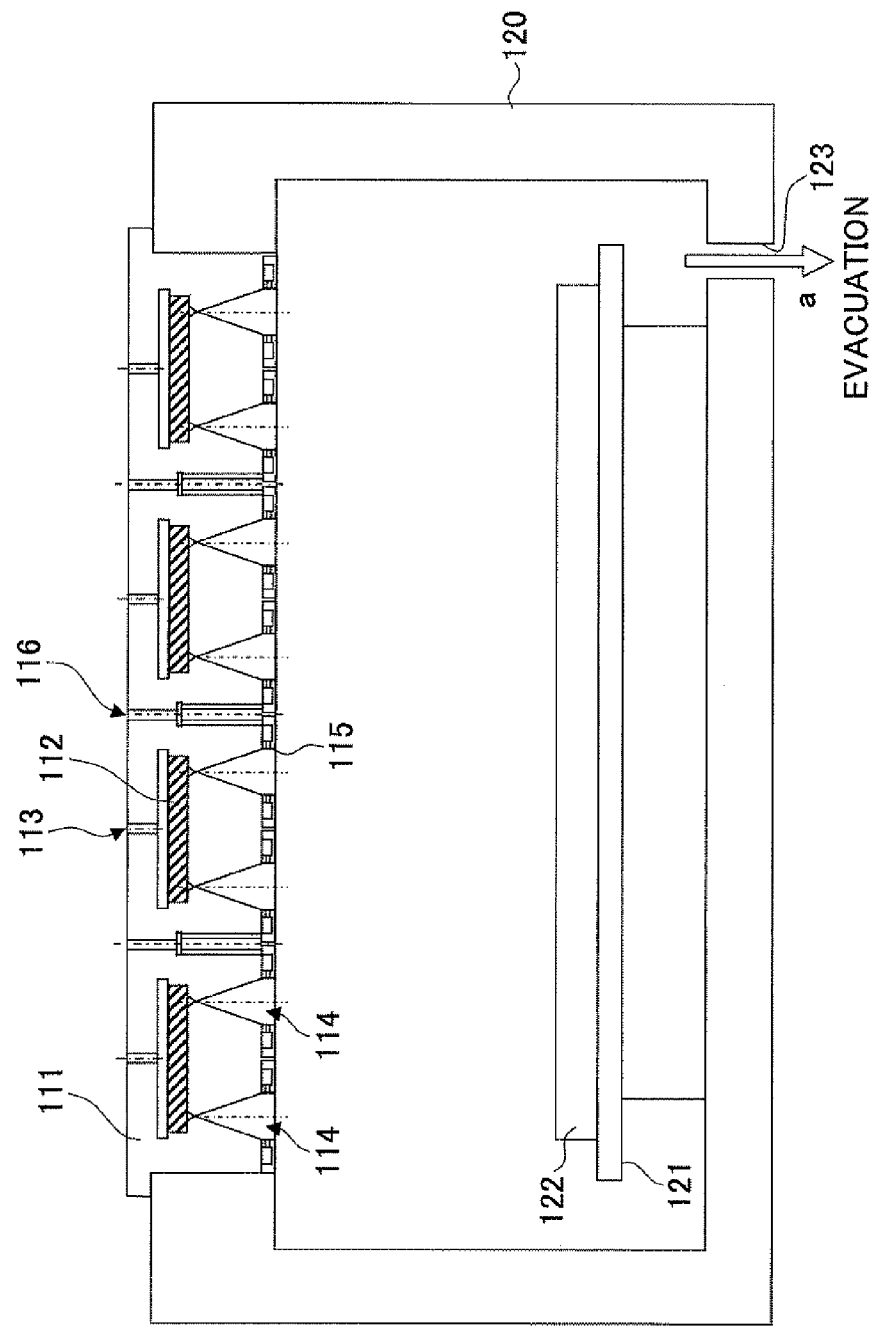
FIG. 12 is a configuration diagram of another film deposition apparatus of the altered example 1 of the first embodiment (Part 2).

In addition, a film deposition apparatus shown in FIG. 12 is provided with plural ejection holes 114 that cause the high temperature $H_2O$ gas to be ejected from the catalysts 112 into the chamber 120. These ejection holes 114 are larger than the ejection holes in the film deposition apparatus shown in FIG. 11.

Figure 13:
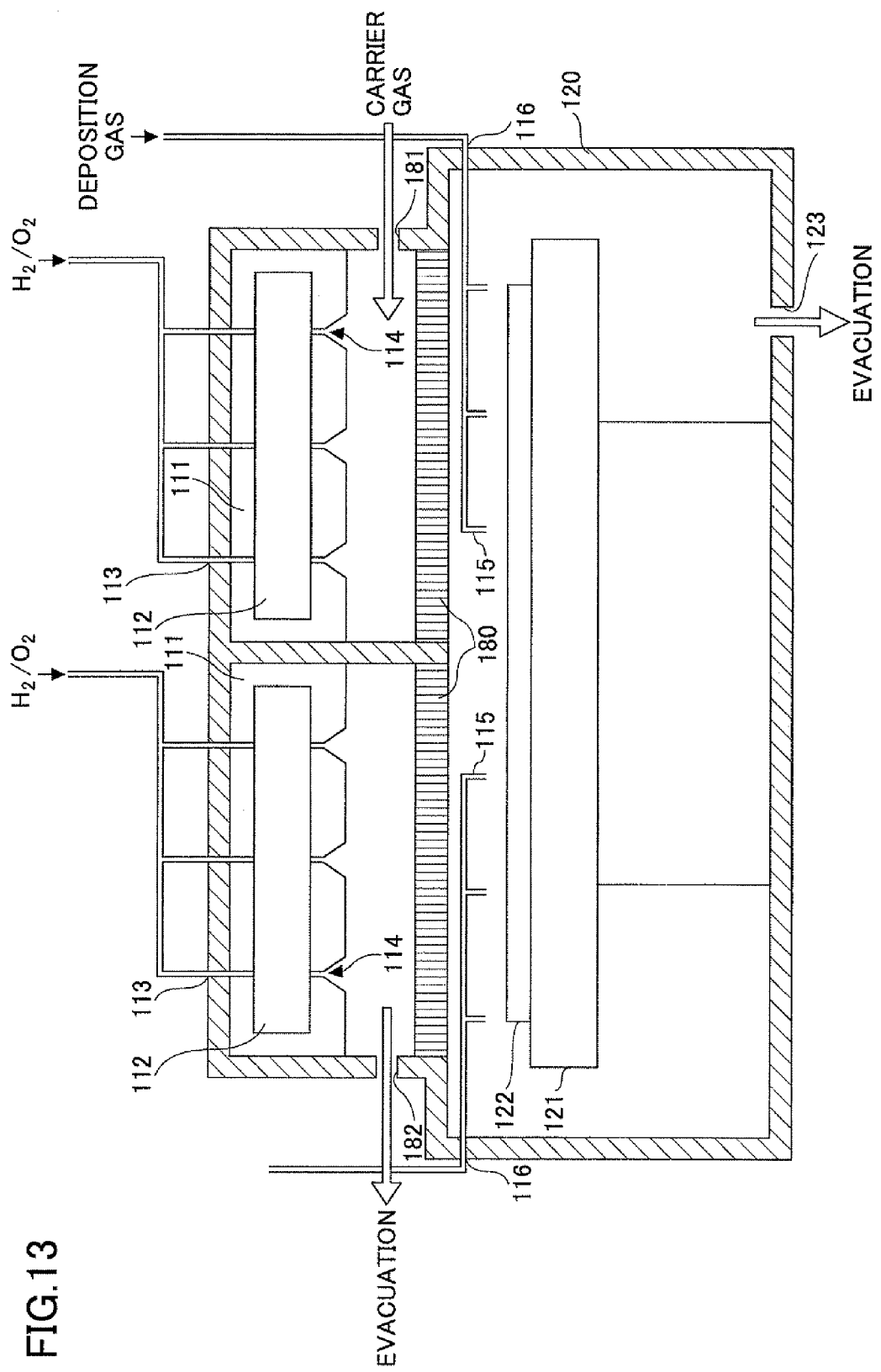
FIG. 13 is a configuration diagram of another film deposition apparatus of the altered example 1 of the first embodiment (Part 3).

In addition, in a film deposition apparatus shown in FIG. 13, the catalysts 112 are provided in a catalyst reaction containers 111, and plural gas inlets 113 for introducing the mixed gas or like of the $H_2$ gas and the $O_2$ gas are provided in the catalysts 112. From plural ejection holes 114, the high temperature $H_2O$ gas is ejected. A deposition gas is introduced from deposition gas inlets 116, and ejected from distal ends of deposition gas nozzles 115. The supplied deposition gas reacts with the high temperature $H_2O$ gas mainly in a gaseous phase, and a film of the reaction product is deposited on a substrate 122 placed on a stage 121. This film deposition apparatus is provided with a shower plate 180 for realizing uniform film deposition over the substrate 122. In order to flow a carrier gas between the catalyst reaction container 111 and the shower plate 180, a carrier gas inlet 181 and a carrier gas evacuation opening 182 are provided. Incidentally, an evacuation opening 123 is provided in the lower portion of the chamber 120, and the chamber 120 is evacuated by a vacuum pump (not shown) through the evacuation opening 123.

Figure 14:
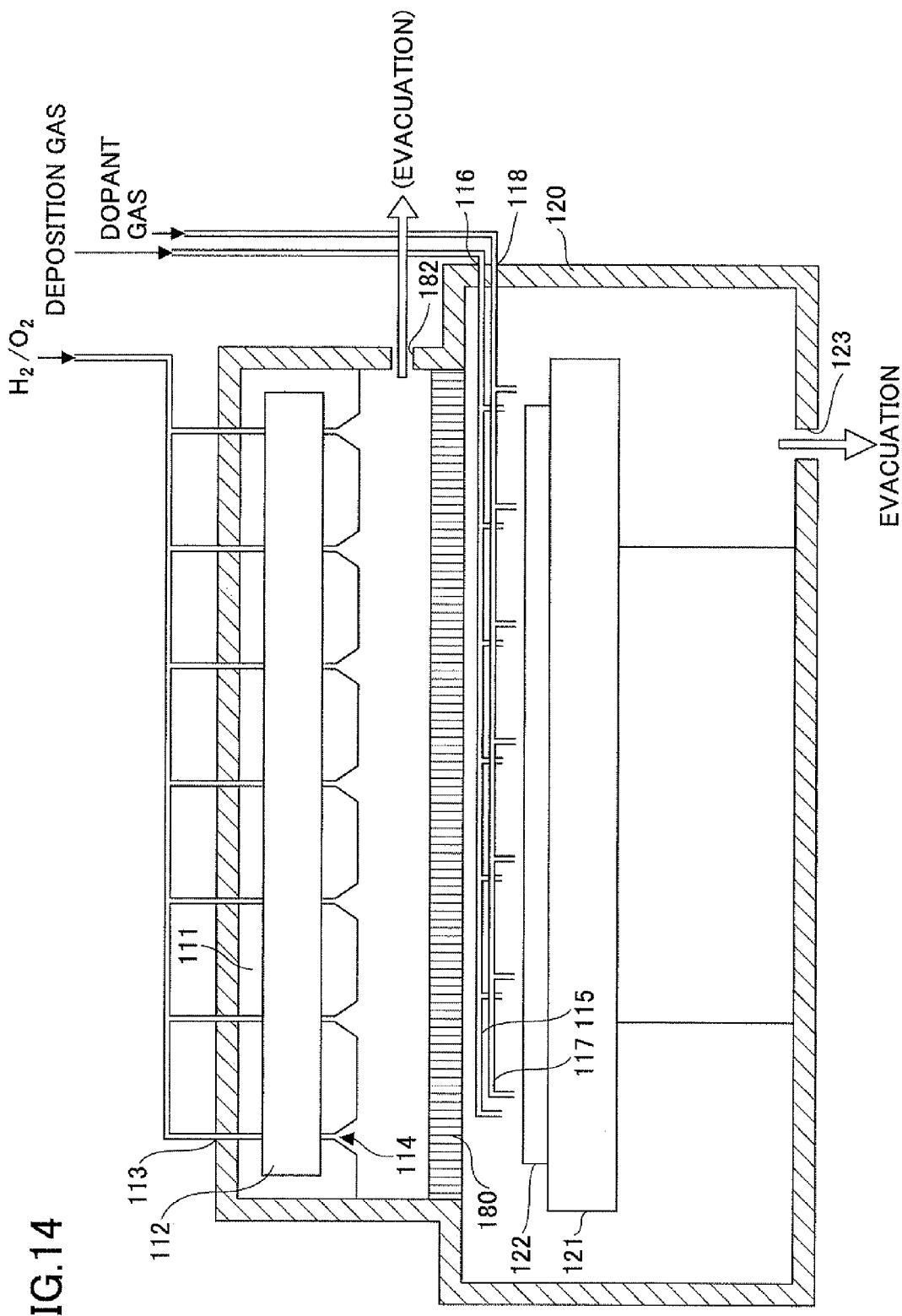
FIG. 14 is a configuration diagram of another film deposition apparatus of the altered example 1 of the first embodiment (Part 4).

In addition, a film deposition apparatus shown in FIG. 14 is configured to be able to supply a dopant gas. Specifically, a gas composed of a metal organic compound such as TMA ($Al(CH_3)_3$) or the like serving as a dopant gas is introduced from a dopant gas inlet 118 of a dopant gas nozzle 117. The introduced dopant gas is supplied from the distal end of the dopant gas nozzle 117, and aluminum or the like is added as a dopant in a film deposited on a surface of the substrate 122.

Figure 15:
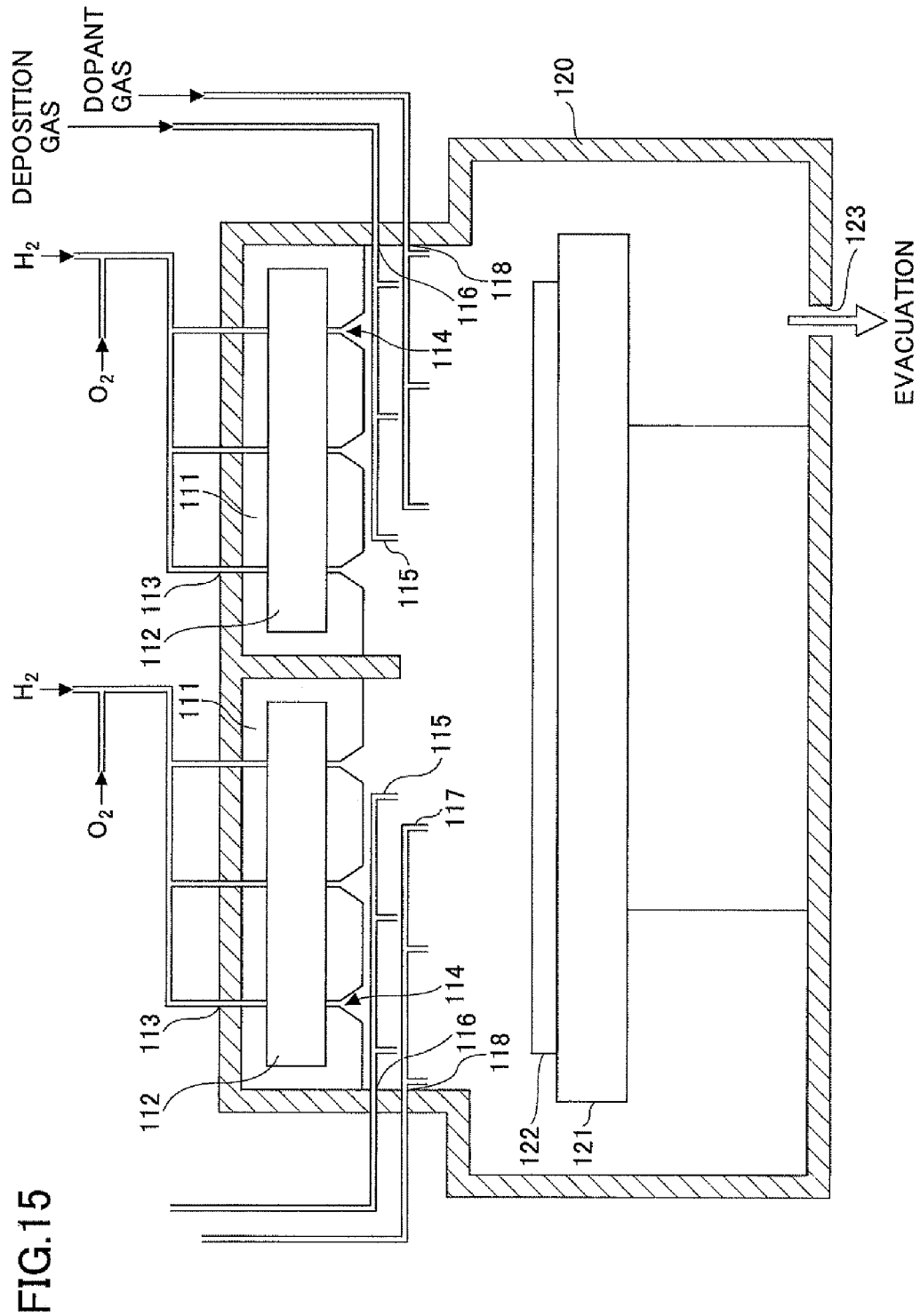
FIG. 15 is a configuration diagram of another film deposition apparatus of the altered example 1 of the first embodiment (Part 5).

In addition, a film deposition apparatus shown in FIG. 15 is able to separately supply the $H_2$ gas and the $O_2$ gas, which are introduced from the gas inlets 113. Although graphic representation is omitted, this film deposition apparatus may have the same gas supplying system as that in the film deposition apparatuses shown in FIG. 8 and FIG. 9, which makes it possible to separately supply the $H_2$ gas and the $O_2$ gas.

Figure 16:
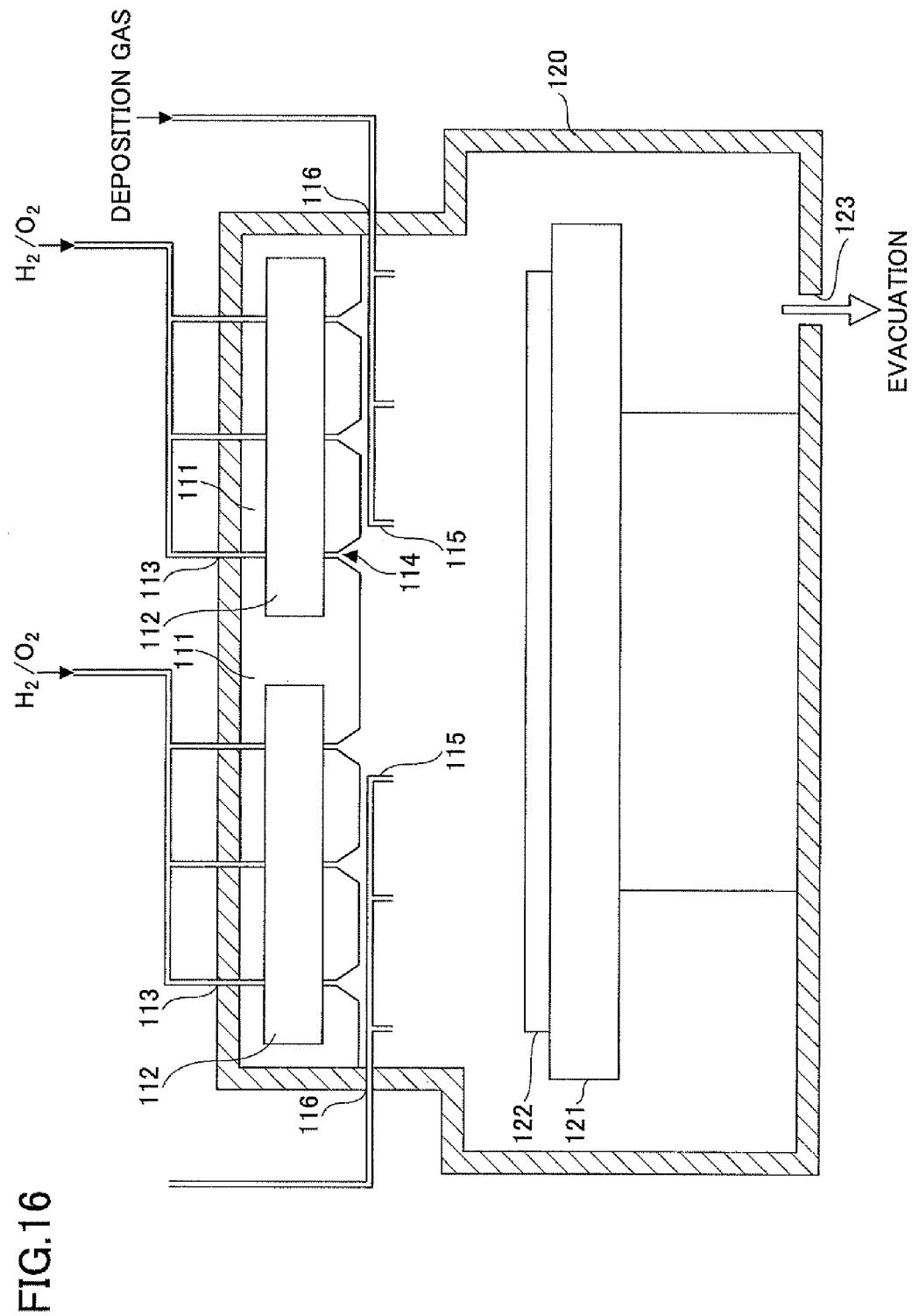
FIG. 16 is a configuration diagram of another film deposition apparatus of the altered example 1 of the first embodiment (Part 6).

In addition, a film deposition apparatus shown in FIG. 16 is different from the film deposition apparatus shown in FIG. 13 in that the shower plate 180, the carrier gas inlet 181, and the carrier gas evacuation opening 182 in the film deposition apparatus shown in FIG. 13 are lacking, and the same as the film deposition apparatus shown in FIG. 13 in terms of other configurations.

The film deposition apparatus according to this altered example is preferable in that a transparent electrically conductive film composed of a metal oxide or the like is uniformly deposited in a large-area.

Altered Example 2

Next, a film deposition method according to an altered example 2 of the first embodiment of the present invention is explained. Specifically, a case where a compound film such as a nitride film is deposited by the film deposition method of the altered example 2 is explained.

In this film deposition method, a nitrogen supplying gas is introduced into a catalyst reaction container that has a deposition gas nozzle and is arranged in a reaction chamber that is evacuatable to reduced pressures, and a reaction gas, which is obtained by the nitrogen supplying gas contacting a catalyst in the form of microparticles, is ejected from the catalyst reaction container. The ejected reaction gas reacts with a metal organic compound gas (vapor) and thus a metal nitride film is deposited on a substrate.

Specifically, one or more kind of nitrogen supplying gases, which are selected from hydrazine and oxy-nitrides, contacts with the catalyst in the form of microparticles in the catalyst reaction container; the reaction gas heated to high temperatures of 700 through 800° C. is produced and ejected from the ejection nozzle thereby to be mixed and react with the metal organic compound gas serving as a source material of the metal nitride film in a gaseous phase; and thus the metal nitride film is deposited on a substrate surface. Incidentally, the nitride supplying gas preferably includes hydrazine.

As an example of the catalyst accommodated in the catalyst reaction container, there is a carrier in the form of microparticles having an average particle diameter of 0.05 mm through 2.0 mm, which carries a catalyst component in the form of ultra-microparticles having an average particle diameter of 1 nm through 10 nm. As an example of the catalyst component in this case, there is a metal such as platinum, ruthenium, iridium, and copper. In addition, metal powders or microparticles of platinum, ruthenium, iridium, copper, or the like may be used as the catalyst.

As the carrier, microparticles of metal oxides such as aluminum oxide, zirconium oxide, silicon oxide, and zinc oxide, that is, microparticles of ceramic oxides, microparticles of zeolite, and the like may be used. A preferable carrier can be obtained by subjecting porous γ-alumina to a thermal process at 500° C. through 1200° C. to transform the porous γ-alumina into an α-alumina crystal phase while maintaining the surface structure thereof.

As a catalyst preferably used, there may be nanoparticles of ruthenium and iridium of 1 through 30 wt. % carried by the aluminum oxide carrier (for example, 10 wt. % Ru/α-$Al_2O_3$ catalyst), and the like.

The film deposition method according to this altered example is explained with reference to FIG. 1. In the film deposition apparatus of FIG. 1, when one or more kinds of the nitrogen supplying gases, which are selected from hydrazine and nitride oxides, is introduced from the gas inlets 13, a decomposition reaction of the nitride supplying gas takes place due to the catalyst 12 in the microparticles. This reaction produces a large amount of heat, and a reaction gas heated by the reaction heat up to 700 through 800° C. is vigorously ejected from the ejection holes 14 toward the substrate held by a substrate holder (not shown). The ejected reaction gas reacts in a gaseous phase with the metal organic compound gas that is introduced from the deposition gas inlets 16 connected to a metal organic compound supplying portion and supplied from the distal end of the deposition gas nozzles 15, and the metal nitride film is deposited on the substrate surface.

Incidentally, the catalyst reaction container 11 may be divided into two compartments, and a first catalyst reaction compartment may be arranged in a front stage and a second catalyst reaction compartment may be arranged in a latter stage. With this, a two-stage catalyst reaction may take place in the catalyst reaction container 11. For example, when hydrazine is used as the nitrogen supplying gas, a hydrazine decomposing catalyst that decomposes hydrazine into ammonia components may be supplied in the first catalyst reaction compartment and an ammonia decomposing catalyst that decomposes the ammonia components into radicals may be supplied in the second catalyst reaction compartment.

As such a hydrazine decomposing catalyst supplied in the first catalyst reaction compartment, a carrier in the form of microparticles of, for example, alumina, silica, zeolite or the like carrying iridium ultra-microparticles of 5 through about 30 wt. % may be used. In addition, as the ammonia decomposing catalyst supplied in the second catalyst reaction compartment, the same carrier carrying ruthenium ultra-microparticles of 2 through 10 wt. % may be used.

Such a two-stage decomposition reaction may proceed as follows:

$$2N_2H_4 \rightarrow 2NH_3 + H^*_2 \qquad (1)$$

$$NH_3 \rightarrow NH^* + H^*_2, NH^*_2 + H \qquad (2)$$

As described above, in this example, one or more kinds of the nitrogen supplying gases, which are selected from the hydrazine and nitride oxides, are introduced into the catalyst reaction apparatus 5, and the reaction gas having high energy, which is obtained by the nitrogen supplying gas contacting the catalyst in the from of microparticles, is ejected from the catalyst reaction apparatus to thereby react with the metal organic compound gas, thereby efficiently depositing the metal nitride film on various substrates at low cost without requiring a large amount of electric energy. Such a chemical reaction accompanied with a large amount of heat can be realized by selecting a specific gas serving as the oxygen source and using the catalyst.

In this example, because there is no need for heating the substrate to higher temperatures, a high quality hetero-epitaxial film can be formed on the substrate even at a low temperature of 600° C. or lower, at which temperature a high quality film is not realized by a conventional thermal CVD method. Therefore, semiconductor materials, electronic materials, and the like can be produced in a large area at low cost using a substrate that used to be difficult to use. In addition, because it is unnecessary to use a large amount of ammonia, which is toxic, while use of a large amount of ammonia is inevitable in the conventional methods, an environmental burden can be significantly reduced.

As the nitride to be deposited on the surface of the substrate, there may be metal nitrides such as aluminum nitride, indium nitride, gallium indium nitride (GaInN), gallium aluminum nitride (GaAlN), gallium indium aluminum nitride (GaInAlN) and a semi-metal nitride, without being limited to the gallium nitride described above. The semi-metal nitride includes a semiconductor nitride, an example of which is silicon nitride.

When depositing a metal nitride film, a metal compound gas serving as a source is not specifically limited. For example, any metal organic compound gas that is used to form a metal nitride by conventional CVD methods may be used. As such a metal organic compound, there may be alkyl compounds, alkenyl compounds, phenyl or alkyl phenyl compounds, alkoxide compounds, di-pivaloyl methane compounds, halides, acetylacetonate compounds, EDTA compounds or the like of various metals.

As a preferable metal organic compound, there may be alkyl compounds and alkoxide compounds of various metals. Specifically, trimethyl gallium, triethyl gallium, trimethyl aluminum, triethyl aluminum, trimethyl indium, triethyl indium, triethoxy gallium, triethoxy aluminum, triethoxy indium, or the like may be pointed out.

When depositing a gallium nitride film on a surface of a substrate, preferably, trialkyl gallium such as trimethyl gallium and triethyl gallium is used as a source material and porous alumina in the form of microparticles carrying ruthenium ultra-microparticles is used as catalyst.

In addition, a metal compound gas serving as a source material of a metal nitride is not limited to the metal organic compound gases, but may be an inorganic metal compound. The inorganic metal compound is, for example but not limited to, a halide gas except for the metal organic compounds, and specifically, chloride gases such as gallium chloride gases (GaCl, GaCl$_2$, GaCl$_3$). In addition, when the inorganic metal compound gas is used, a gas cylinder filled with the inorganic metal gas is provided in the deposition apparatus, and the inorganic metal compound gas may be introduced via the deposition gas nozzle 15.

When the silicon nitride film is formed on the substrate surface, silicon hydrides, silicon halides, and organic silicon compounds, for example, can be used as the silicon source material. As an example of the silicon hydrides, there may be silane and disilane. As an example of the silicon halides, there may be silicon chlorides such as dichlorosilane, trichlorosilane, and tetrachlorosilane. As an example of the organic silicon compounds, there may be tetraethoxysilane, tetramethoxysilane, or hexamethyldisilazane.

As a substrate, one that is selected from metal, metal nitride, glass, ceramic material, semiconductor, and plastic may be used.

As a preferable substrate, a compound single crystal substrate typified by sapphire or the like, a single crystal substrate typified by silicon or the like, an amorphous substrate typified by glass, and an engineering plastic substrate such as polyimide may be pointed out.

In addition, the carrier may have a shape having many pores such as a sponge form, a bulk shape including a honeycomb form having penetrating holes, or the like. Moreover, the shape of the catalyst material, such as platinum, ruthenium, iridium and copper, is not limited to the microparticle form, but may be a film form, for example. A surface area of the catalyst material is preferably large in order to certainly obtain the effects of this embodiment. Therefore, when the film of the catalyst material is formed on a surface of the above carriers, for example, the effects similar to those obtainable in the case of the microparticle form can also be obtained because the surface area of the catalyst material can be enlarged.

With these, the metal nitride film can be formed in this example.

Altered Example 3

Next, a film deposition method according to an altered example 3 of the first embodiment of the present invention is explained. In the film deposition method of the altered example 3, especially the H$_2$ gas and the O$_2$ gas are intermittently supplied.

Figure 17:
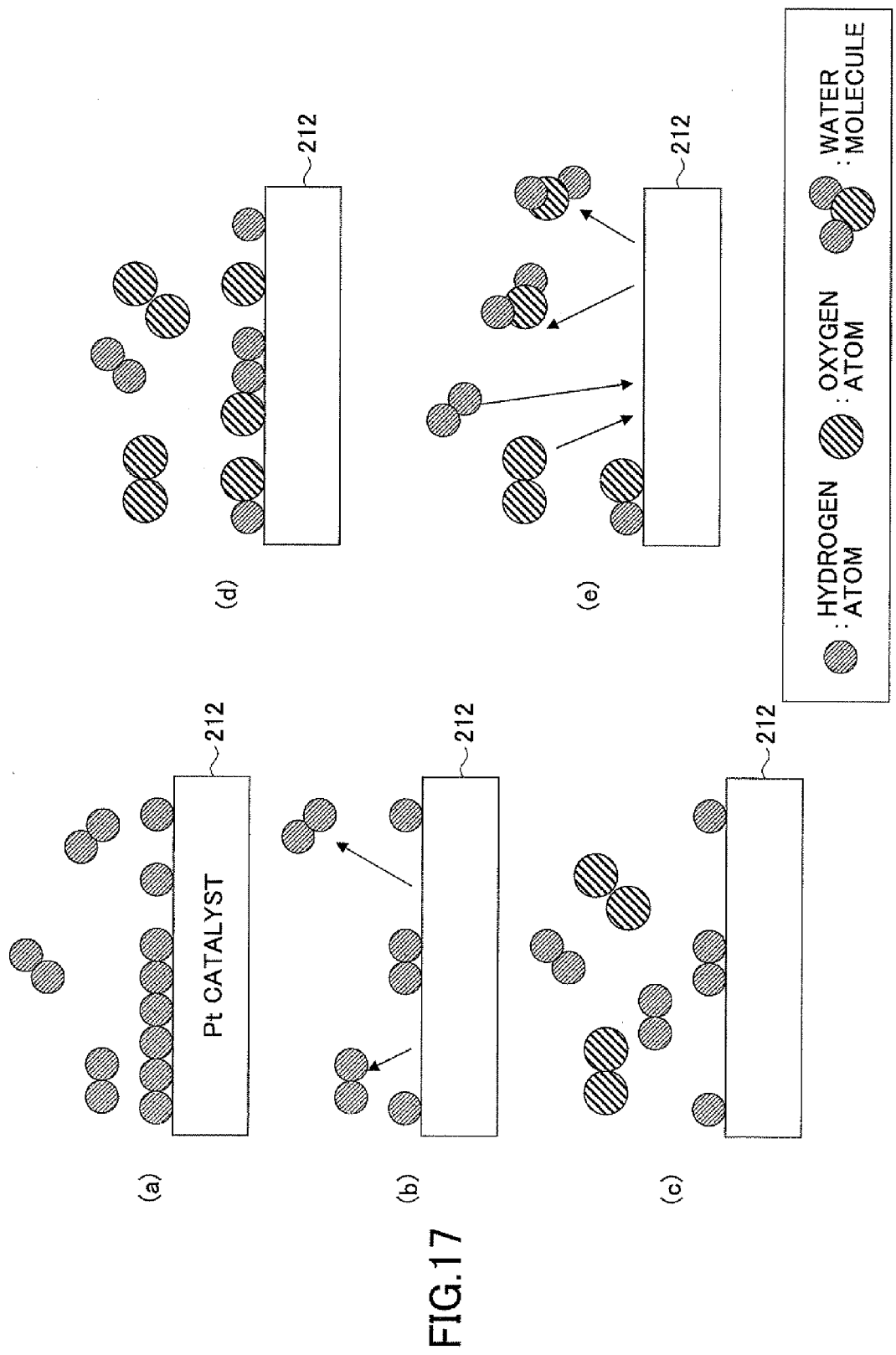
FIG. 17 is a process explanation diagram of an altered example 3 of the first embodiment.

Referring to FIG. 17, the film deposition method of this altered example is explained.

First, the H$_2$ gas is introduced as shown in FIG. 17(a). With this, a substance adsorbed on a surface of Pt catalyst 212 serving as a catalyst used in this embodiment is reduced, so that cleaning is carried out, and H atoms are chemically bonded on the surface of the Pt catalyst 212.

Here, when H$_2$ gas pressure is decreased, part of the H atoms that have been adhered may be desorbed, but the remaining part of them remain on the surface of the Pt catalyst 212 (see FIG. 17(b)).

Next, the O$_2$ gas is introduced as shown in FIG. 17(c).

By introducing the O$_2$ gas, O atoms are chemically adsorbed on the Pt catalyst 212 (see FIG. 17(d)), and the O atoms and the H atoms migrate on the surface of the Pt catalyst 212.

Then, as shown in FIG. 17(e), the O atoms and the H atoms react with each other so that H$_2$O is produced and desorbed from the surface of the Pt catalyst 212. This chemical reaction is an exothermic reaction, and a temperature of the Pt catalyst 212 is raised up to about 1700° C. by this reaction. With this thermal energy, a gaseous phase reaction described later is caused.

Incidentally, after the $H_2O$ is desorbed from the surface of the Pt catalyst 212, the O atoms and the H atoms are adsorbed on an area where the $H_2O$ has been desorbed and the catalyst reaction that produces $H_2O$ is repeated.

Bonding energy of Pt and O is greater than bonding energy of Pt and H, and thus once the surface of Pt is covered by O, the catalyst reaction does not proceed. Because such a phenomenon is caused by introducing the $O_2$ gas earlier than the $H_2$ gas, the phenomenon can be avoided when the $H_2$ gas is introduced earlier than the $O_2$ gas or at least at the same time. This altered example is based on the finding.

Next, the film deposition method according to this altered example is explained. In the film deposition method according to this altered example, the $O_2$ gas, the $H_2$ gas, and the deposition gas composed of a metal organic compound are introduced in the film deposition apparatus shown in FIG. 8 at a timing shown in FIG. 18. This control is carried out by controlling opening/closing of the control valves 65, 66, 67 and flow rates. Incidentally, the open/close valves 61, 62 are open and one of the open/close valves 63, 64 is open.

Figure 18:
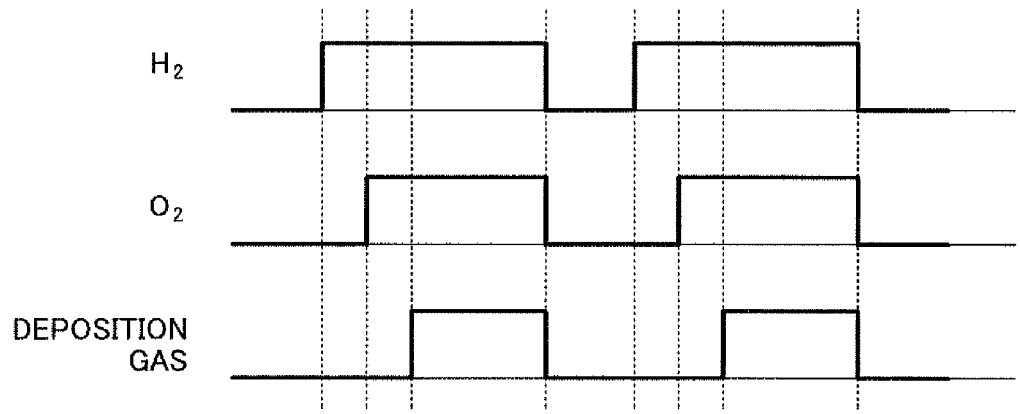
FIG. 18 is a timing chart of a film deposition process of the altered example 3 of the first embodiment.
Figure 19:
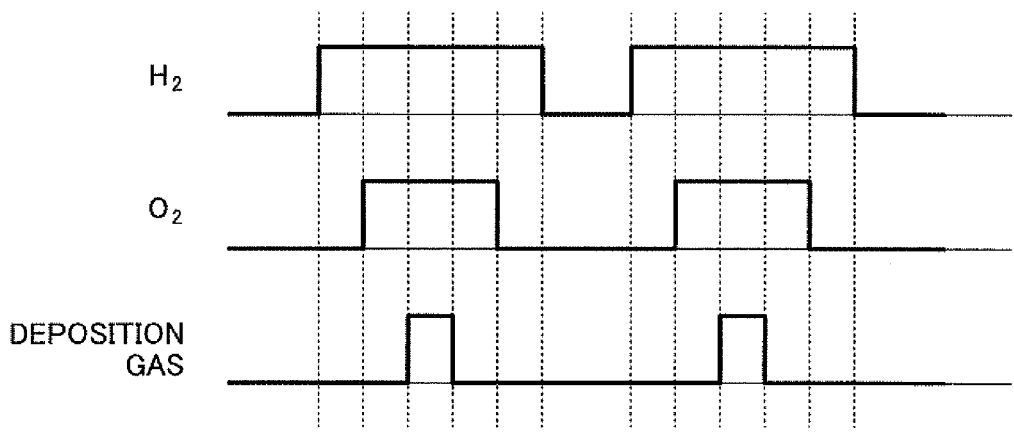
FIG. 19 is a timing chart of another film deposition process of the altered example 3 of the first embodiment (Part 1).

As shown in FIG. 18, first, the control valve 66 is opened and the $H_2$ gas in introduced, and then the control valve 65 is opened and the $O_2$ gas is introduced. With this, the high temperature $H_2O$ gas is produced in the catalyst reaction container 11.

Then, the control valve 67 is opened and the deposition gas is introduced, so that a metal oxide is deposited on the substrate 22.

Subsequently, the control valves 65, 66, 67 are closed at the same time, thereby terminating supplying the $H_2$ gas, the $O_2$ gas, and the deposition gas.

Next, the procedures so far are repeated predetermined times, so that a metal oxide film having a predetermined film thickness is deposited on the substrate 22. By terminating the supply of the $O_2$ gas (in other words, by decreasing a flow rate of the $O_2$ gas to 0 sccm), the O atoms adhered on the surface of the catalyst 12 in the catalyst reaction container 11 can be reduced, thereby facilitating adhesion of the H atoms on the surface of the catalyst 12. Therefore, the high temperature $H_2O$ gas is efficiently produced.

More preferably, first, the control valve 66 is opened thereby introducing the $H_2$ gas; next, the control valve 65 is opened thereby introducing the $O_2$ gas; and then, the control valve 67 is opened thereby introducing the deposition gas, so that the film is deposited on the substrate 22.

Subsequently, the control valve 67 is closed thereby terminating the supply of the deposition gas; next, the control valve 65 is closed thereby terminating the supply of the $O_2$ gas; and then, the control valve 66 is closed thereby terminating the supply of the $H_2$ gas. By terminating the supply of the $H_2$ gas at the end, the adsorption of the O atoms on the surface of the catalyst Pt can be prevented, thereby efficiently carrying out the film deposition.

The above intermittent supply of the gases is repeated preferably at a frequency of 1 Hz through 1 kHz. In the case of 1 Hz or less, there is a problem in that production efficiency is reduced, and in the case of 1 kHz or more, it becomes difficult to obtain an excellent film property. In addition, because the deposition gas is supplied while the $H_2$ gas and the $O_2$ gas are being introduced, a time when the deposition gas is supplied is desirably 1 s or less.

In addition, in the film deposition method according to this altered example, the same effects are obtained by controlling the $O_2$ gas and the deposition gas while the $H_2$ gas is kept flowing. Moreover, the same effects are obtained by changing a partial pressure of the $H_2$ gas and the $O_2$ gas. Specifically, it is preferable that a time period is provided during which the partial pressure of the $O_2$ gas is reduced thereby facilitating adhesion of the H atoms on the surface of the catalyst 12 in a time period during which the deposition gas is not supplied, and then the partial pressure of the $O_2$ gas is increased again. Incidentally, a flow rate of the $H_2$ gas may be increased in order to reduce the partial pressure of the $O_2$ gas.

Figure 20:
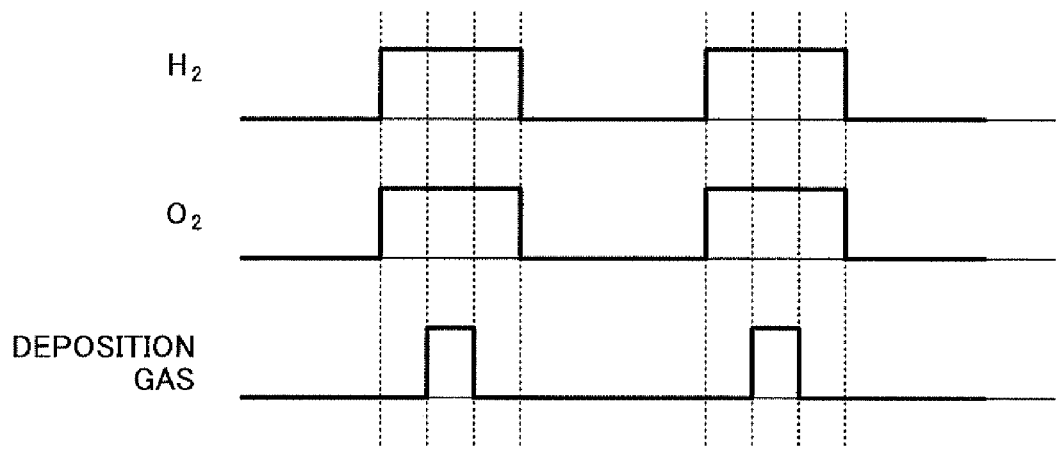
FIG. 20 is a timing chart of another film deposition process of the altered example 3 of the first embodiment (Part 2).

In addition, the film deposition method has effects of preventing the catalyst reaction from being impeded, by supplying the $O_2$ gas earlier than the $H_2$ gas. Such effects can be obtained when the $H_2$ gas and the $O_2$ gas are supplied substantially at the same time as shown in FIG. 20. Moreover, the same effects can be obtained when a total pressure is changed while keeping a constant partial pressure of the $H_2$ gas and the $O_2$ gas.

Incidentally, when the $H_2$ gas and the $O_2$ gas are supplied at a constant total pressure and a constant partial pressure, the high temperature $H_2O$ gas can be produced. But it is preferable to intermittently supply the $O_2$ gas from a viewpoint of production efficiency of the high temperature $H_2O$ gas.

In this altered example, the intermittent supply of a gas includes not only a case where a time period during which the gas is supplied and a time period during which the gas is not supplied (or supplied at a flow rate of 0 sccm) are alternately repeated, but also a case where a time period during which the gas is supplied at a predetermined flow rate and a time period during which the gas is supplied at a flow rate smaller than the predetermined flow rate.

Altered Example 4

Next, a film deposition method according to an altered example 4 of the first embodiment is explained. In the film deposition method according to the altered example 4, a timing at which the $H_2$ gas and the $O_2$ gas are supplied and a timing at which the deposition gas is supplied are different from those in the film deposition method according to the altered example 3.

The film deposition method according to this altered example is explained with reference to FIG. 8 and FIG. 21.

Figure 21:
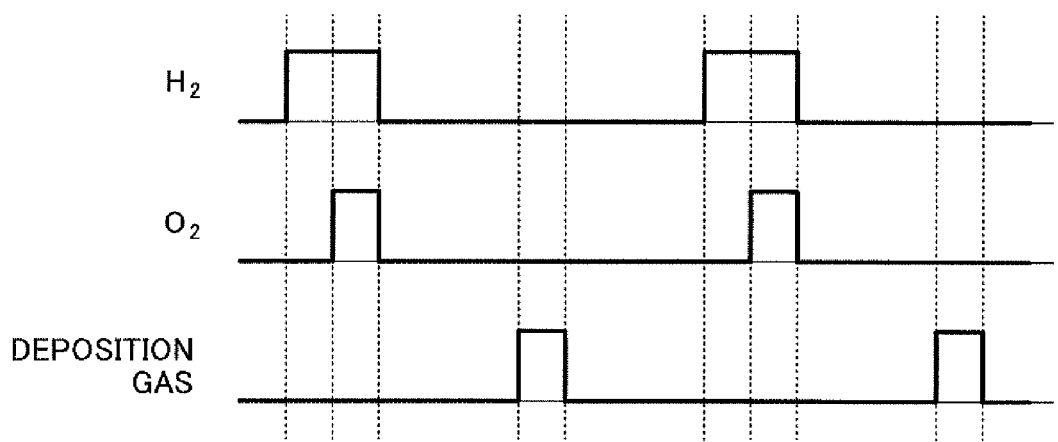
FIG. 21 is a timing chart of a film deposition process of an altered example 4 of the first embodiment.

As shown in FIG. 21, first, the control valve 66 is opened thereby introducing the $H_2$ gas; and next, the control valve 65 is opened thereby introducing the $O_2$ gas. With this, the high temperature $H_2O$ gas is efficiently produced in the catalyst reaction container 11.

Then, the control valves 65, 66 are closed thereby terminating the supply of the $H_2$ gas and the $O_2$ gas.

Then, the control valve 67 is opened thereby introducing the deposition gas, so that a film is deposited on the substrate 22 through the gaseous phase reaction with the high temperature $H_2O$ gas.

Then, the control valve 67 is closed thereby terminating the supply of the deposition gas.

By repeating the procedures, the film is deposited. With such a film deposition process, a high quality film is obtained. Incidentally, this control is carried out by controlling the control valves 65, 66, 67 with the control portion 68.

This altered example is specifically explained.

Oxygen vacancies and impurities such as carbon or hydrogen are included in a high permittivity dielectric film composed of an oxide or the like, which is deposited by a conventional Atomic Layer Deposition (ALD) method. Because such vacancies and impurities may form traps and/or fixed electric charges, an electric property of a transistor may be degraded. While there are various methods of reducing the oxygen vacancies and the impurities, there is a problem in that an apparatus tends to be expensive, or a process becomes complicated in those methods.

One of the causes of impurities and the like remaining in the film deposited by the ALD method may be a low substrate temperature when a source gas is introduced and an oxidation reaction is caused by supplying an oxidation gas such as moisture. Although a chemical reaction proceeds generally at higher temperatures, a monolayer is not formed when the substrate temperature is increased because the gas tends not to be adsorbed.

The film deposition method according to this altered example is based on findings, as a result of vigorous investigations of the present inventors, of employing the high temperature $H_2O$ gas produced by reacting the $H_2$ gas and the $O_2$ gas on the catalyst thereby accelerating the oxidation reaction of a metal deposition gas.

Namely, after the metal organic compound used as the deposition gas is intermittently supplied, purging is carried out thereby forming a monolayer; the $H_2$ gas and the $O_2$ gas are introduced into the catalyst reaction container 11; the high temperature $H_2O$ gas produced through the reaction of the gases is supplied to the surface of the substrate 22 as a semiconductor substrate; and thus the monolayer of the metal organic compound formed on the surface of the substrate 22 is oxidized in this altered example.

With this, even when the substrate temperature is 300° C., because the $H_2O$ gas as the reaction gas is at higher temperatures, the oxidation reaction is accelerated, thereby reducing a concentration of the impurities remaining in the film, as a result. Incidentally, because annealing per one film deposition cycle is not carried out, a time per one cycle is short and thus the film deposition time is reduced, thereby enhancing production efficiency. In addition, because an amount of Pt as the catalyst 12 to be used is small, an apparatus cost can be reduced.

The substrate 22 used in this altered example may be a p-type (100) surface silicon substrate having a relative resistance of 10 Ωcm. After being cleaned in advance, a $SiO_2$ film having a film thickness of 1 nm is formed on the substrate 22 by a thermal oxidation method. The substrate 22 is placed on the stage 21 inside the chamber 20 of the film deposition apparatus, and heated up from its back surface to about 300° C. by a heater (not shown) provided in the stage 21 after the chamber 20 is evacuated down to $1 \times 10^{-3}$ Pa. At the same time, pressure inside the chamber 20 is adjusted to 100 Pa by introducing $N_2$ gas from a $N_2$ gas inlet (not shown).

In addition, as the metal organic compound serving as the deposition gas, tetrakis(ethylmethylamino)hafnium (TEMAH) is used and introduced from the deposition gas inlets 16 of the deposition gas nozzles 15.

Under the above conditions, a cycle is repeated 120 times which includes introducing the $H_2$ gas for 2 seconds, introducing, during this period, the $O_2$ gas for 1 second, supplying TEMAH for 1 second three seconds after the supply of the $H_2$ gas is terminated, and introducing the $H_2$ gas again three seconds after the supply of the TEMAH is terminated. With this, an $HfO_2$ film having a film thickness of about 8 nm is formed.

According to this embodiment, high quality oxide films can be obtained in a short period of time using a low cost apparatus.

In addition, while an example of $HfO_2$ is explained in this embodiment, $ZrO_2$, $TiO_2$, $La_2O_3$, $Pr_2O_3$, $Al_2O_3$, $SrTiO_3$, $BaTiO_3$, $BaSrTiO_3$, PZT (PbZrTiO), SBT (SrBiTaO), BSCCO ($Bi_2Sr_2Ca_nCu_n+10_{2n+6}$) or the like can be deposited.

Second Embodiment

A second embodiment relates to a substrate processing method and a substrate processing apparatus according to the present invention.

(Organic Substance Removal Method and Apparatus)

First, an organic substance removal method, which is one kind of substrate processing method according to this embodiment, is explained along with circumstances through which the present invention has been made.

Figure 22A:
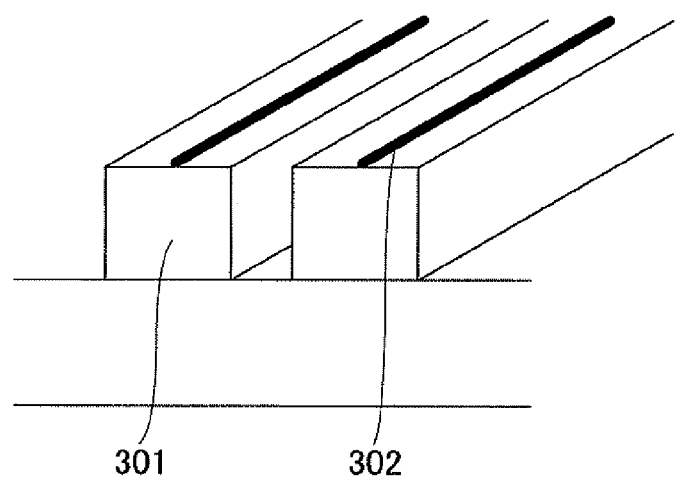
FIG. 22A is a schematic view illustrating resist residue.
Figure 22B:
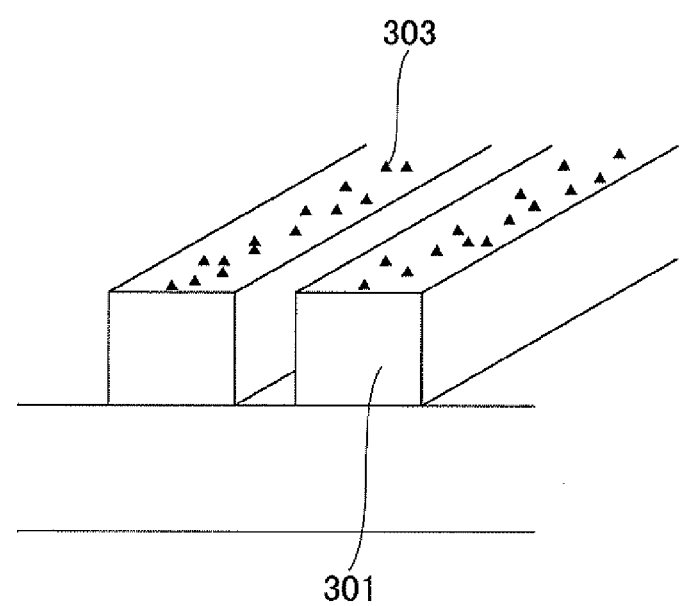
FIG. 22B is a schematic view illustrating resist residue.
Figure 22C:
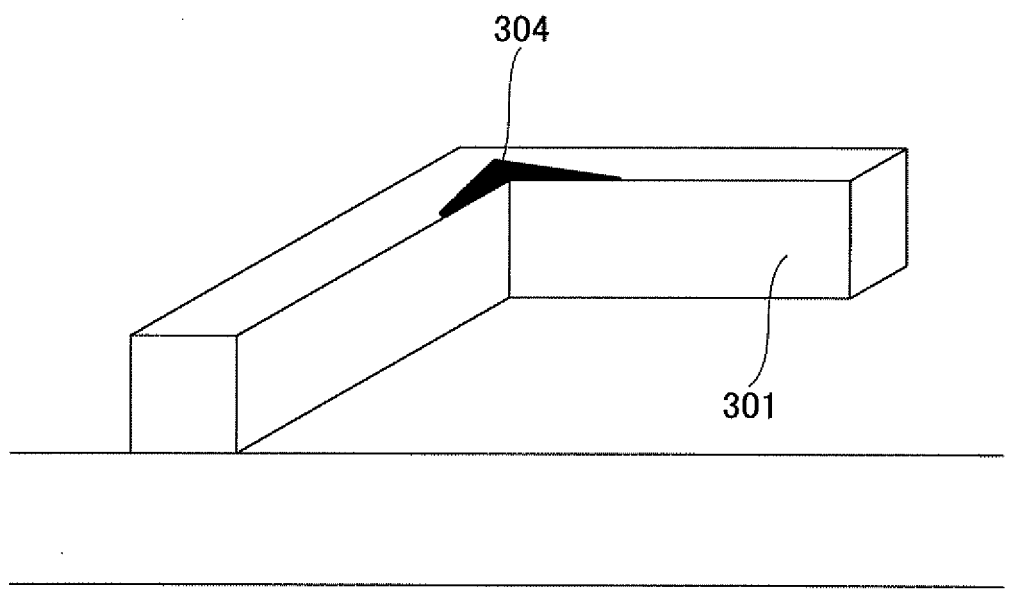
FIG. 22C is a schematic view illustrating resist residue.

An ashing technology for removing an organic substance such as a resist film has been widely used for many years. However, even when the ashing is carried out, resist residue 302 remaining in line shapes in the center of a pattern 301, as shown in FIG. 22A, resist residue 303 remaining at random on the pattern 301, as shown in FIG. 22B, and resist residue 304 remaining on an edge portion of the pattern 301, as shown in FIG. 22C, may remain.

Such resist residues 302 through 304 tend to be caused, especially after dry-etching or ion-implantation with high dose amounts, and are removed by adding a cleaning process using solutions or the like.

Such resist residues 302 through 304 can be removed by the additional cleaning process. However, such an additional process leads to increased costs, and is not preferable in a fabrication process of semiconductor devices, which demands reduced costs. Namely, when such an additional cleaning process is carried out after every photolithography process is carried out, the cleaning process must be added thirty times when the photolithography process is carried out thirty times in fabrication of the semiconductor devices. Costs and time for the repeated processes are added to the production costs of the semiconductor devices. Therefore, a fabrication process in which such an additional cleaning process needs not be carried out is preferable from a viewpoint of the fabrication costs of the semiconductor devices.

Next, a mechanism by which such resist residues 302 through 304 are caused is explained. After a photoresist mask having a predetermined pattern is formed, when ion-implantation or dry-etching is carried out using the photoresist mask, the photoresist mask is also damaged, and a material (photoresist) that constitutes the photoresist mask is altered, cannot be completely removed by a normal ashing or the like, and remains as the resist residues 302 through 304. In addition, in the dry-etching process, a material that constitutes the substrate or the like and is etched may be re-adhered on a side surface or the like of the photoresist patterns. Such re-adhered materials cannot be easily removed and are left especially as the resist residue 304 shown in FIG. 22C.

In order to remove such resist residues 302 through 304, there is a method using fluorine and hydrogen. However, this method is not satisfactory as a fabrication process of the semiconductor devices, from a viewpoint of problems of corrosivity and contamination.

From such a viewpoint, the fabrication process of the semiconductor devices requires complete removal of resist residues, no usage of strong corrosive gases that may corrode metal lines and the like, and low apparatus and production costs.

This embodiment has been found from the above considerations by the present inventors. Namely, it has been found that the photoresist pattern can be substantially completely removed by the $H_2$ gas and the $O_2$ gas contacting the surface of the catalyst thereby to produce the high temperature $H_2O$ gas, and ejecting the high temperature H₂O gas thereby to oxidize the photoresist pattern on the substrate.

Figure 23:
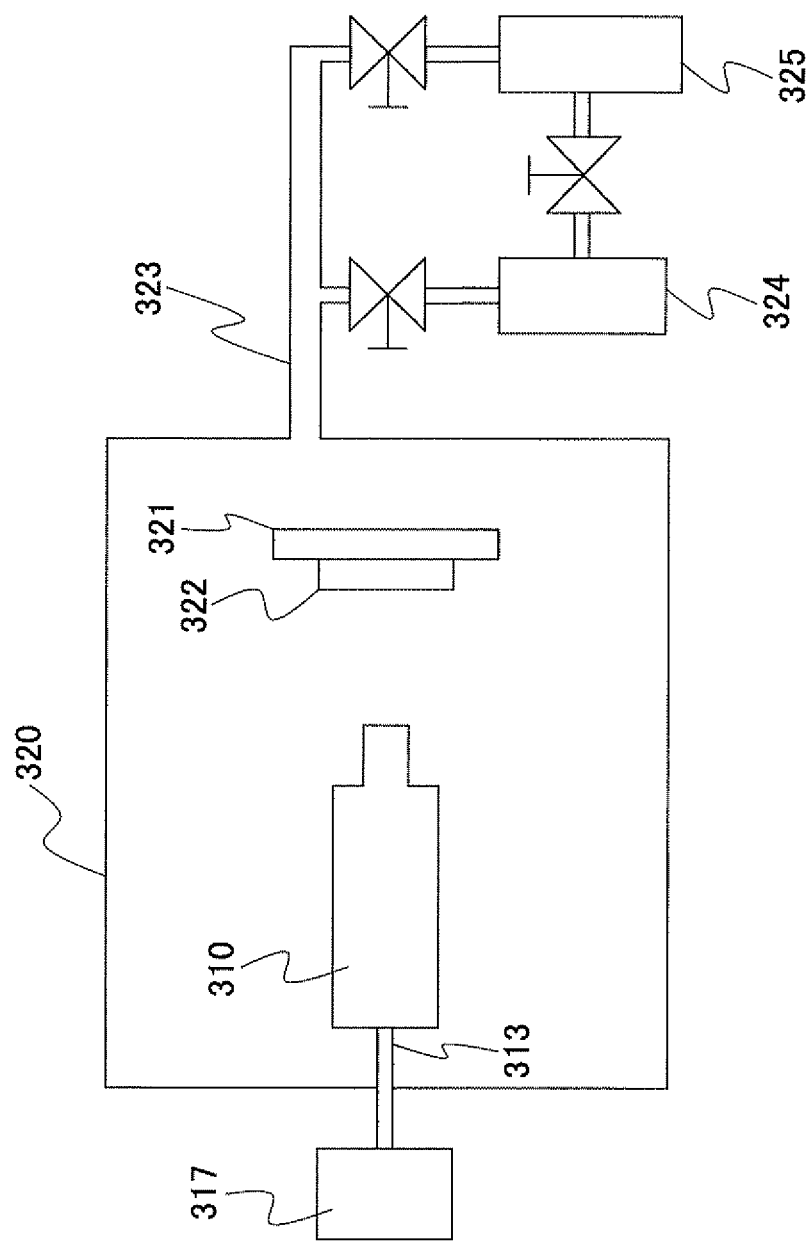
FIG. 23 is an explanatory view for explaining a substrate processing apparatus to be used in a second embodiment.
Figure 24:
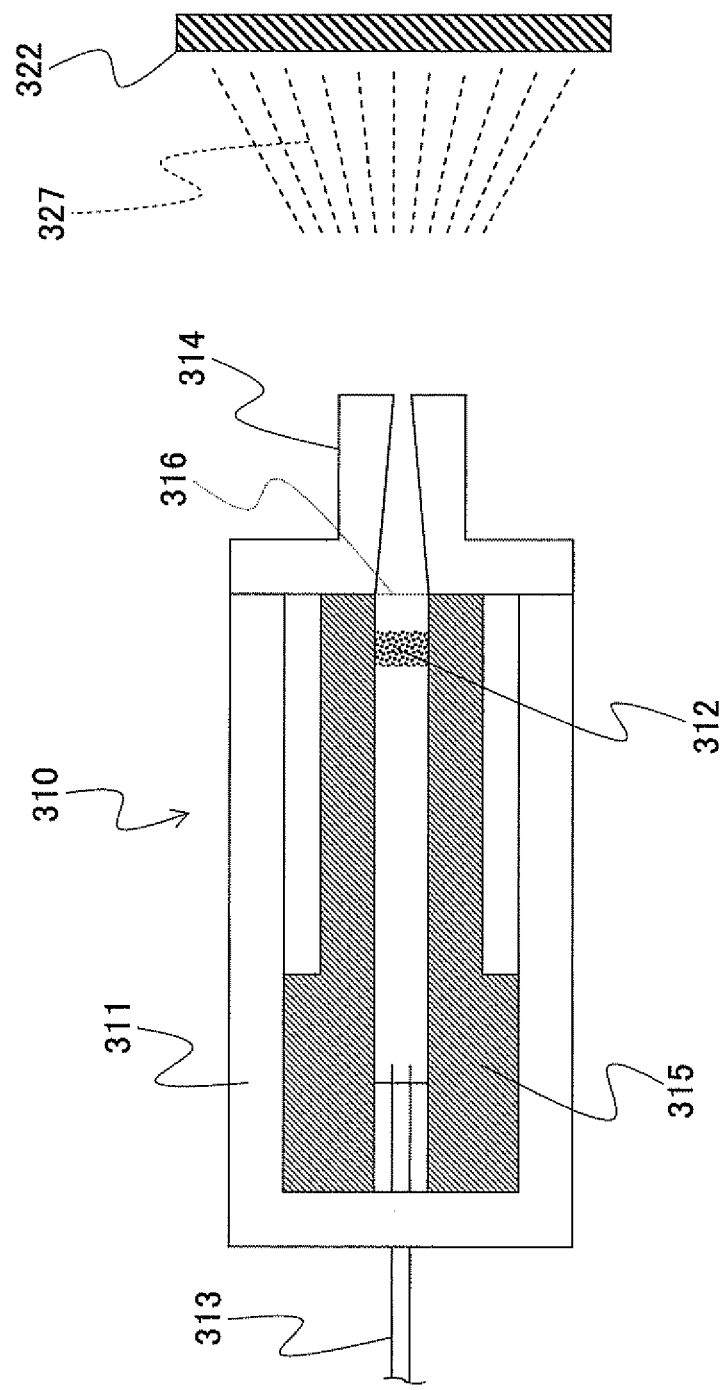
FIG. 24 is an explanatory view for explaining a catalyst reaction portion to be used in the second embodiment.

Next, an apparatus to be used in the organic substance removal method according to this embodiment is explained with reference to FIG. 23 and FIG. 24. FIG. 23 is an entire configuration diagram of an organic compound removal apparatus, and FIG. 24 is a configuration diagram of a catalyst reaction portion of the apparatus.

This apparatus includes a chamber 320 that is evacuatable to vacuum, a gas inlet 313 from which the H₂ gas and the O₂ gas serving as a source gas of the H₂O gas are introduced from a H₂O gas source supplying portion 317, a catalyst reaction portion 310 having an ejection hole 314 that ejects the reaction gas (H₂O) gas, and a substrate holder 321 that supports a substrate 322. The chamber 320 is connected to a turbo molecular pump 324 and a rotary pump 325 via an evacuation pipe 323.

The catalyst reaction portion 310 is configured so that a catalyst reaction container made of materials such as ceramic materials or metals is accommodated in a catalyst container jacket 311 made of metals such as stainless steel, and the catalyst container jacket 311 is provided with an ejection hole 314.

A catalyst 312 that includes carriers in the form of microparticles that carry a catalyst component in the form of ultra-microparticles is arranged inside the catalyst reaction portion 310. The catalyst reaction portion 310 is connected to the H₂O gas source supplying portion 317 via a gas inlet 313 for introducing the H₂O gas source. In addition, a metal mesh 316 for holding the catalyst 312 is arranged in a front stage of the ejection hole 314.

In this embodiment, there can be used as the catalyst 312 a carrier in the form of microparticles having an average particle diameter of 0.05 mm through 2.0 mm, which carries a catalyst component in the form of ultra-microparticles having an average particle diameter of 1 nm through 10 nm, and metal powders or microparticles metal such as platinum, ruthenium, iridium, copper or the like having an average particle diameter of 1 mm through 0.5 mm. As the carrier, microparticles of metal oxides such as aluminum oxide, zirconium oxide and zinc oxide, that is, microparticles of ceramic oxides may be used. As a preferable carrier, there may be a aluminum oxide carrier carrying nanoparticles of platinum, a carrier obtained by subjecting porous γ-alumina to a thermal process at 500° C. through 1200° C. to transform the porous γ-alumina into an α-alumina crystal phase while maintaining the surface structure thereof, the carrier carrying platinum of 1 through 20 wt. % (for example, 10 wt. % Pt/γ-Al₂O₃ catalyst), and the like. Specifically, a catalyst obtained by causing alumina in the form of microparticles to carry platinum ultra-microparticles is preferably used.

In this embodiment, a mixed gas of the H₂ gas and the O₂ gas or H₂O₂ gas, which serves as an oxygen source of the metal oxide thin film, is introduced from the gas inlet 313 and caused to contact the catalyst 312 in the form of microparticles inside the catalyst reaction portion 310 thereby to produce the H₂O gas having high energy. The produced H₂O gas having high energy is ejected from the ejection hole 314 at the distal end of the catalyst reaction portion 310 and reacts with the metal organic compound gas mainly in a gaseous phase, and the metal oxide is produced through the reaction on the substrate. Because the H₂O gas having high energy is produced due to the catalyst reaction of the catalyst 312 and the mixed gas of the H₂ gas and the O₂ gas or the H₂O₂ gas, there is no need for decomposing the mixed gas of the H₂ gas and the O₂ gas or the H₂O₂ gas by heating the substrate 322, which can eliminate the need for a large amount of electric energy.

Therefore, the metal oxide film can be efficiently formed at low cost. Such a chemical reaction accompanied with a large amount of heat can be realized by selecting a specific gas serving as the oxygen source and using the catalyst 312.

Incidentally, the carrier may have a shape having many pores such as a sponge form, a bulk shape including a honeycomb form having penetrating holes, or the like. In addition, the shape or form of the catalyst material, such as platinum, ruthenium, iridium and copper, is not limited to the microparticle form, but may be a film form, for example. Specifically, a surface area of the catalyst material is preferably large in order to certainly obtain the effects of this embodiment. Therefore, when the film of the catalyst material is formed on the above carriers, for example, the effects similar to those obtainable in the case of the microparticle form can also be obtained because the surface area of the catalyst material can be enlarged.

When the mixed gas of the H₂ gas and the O₂ gas or H₂O₂ gas is introduced into the catalyst reaction portion 310 from the gas inlet 313 connected to the H₂O gas source supplying portion 317, a chemical combination reaction of the H₂ gas and the O₂ gas or a decomposition reaction of the H₂O₂ gas takes place due to the catalyst 312 in the form of microparticles. These reactions produce a large amount of heat and a high temperature H₂O gas 327 heated by the reaction heat is vigorously ejected from the ejection hole 314 toward the substrate 322 held by the substrate holder 321. The ejected high temperature H₂O gas oxidizes and removes the resist pattern formed on the substrate 322. Incidentally, a distance between the ejection hole 314 of the catalyst reaction portion 310 and the substrate 322 is several centimeters.

The organic substance removal method according to this embodiment is applicable to removal of various organic substances adhered on a substrate or the like, rather than the photoresist pattern.

Such an embodiment is explained in detail.

γ-Al₂O₃ carriers of 1.0 g having an average particle size of 0.3 mm are impregnated with platinum (IV) chloride hexahydrate of 0.27 g and sintered at 450° C. under vacuum atmosphere for four hours to obtain Pt/γ-Al₂O₃ carriers of 10 wt %. These catalysts of 0.02 g are supplied into the catalyst reaction portion 310, which then is covered with the metal mesh 316, and the catalyst reaction portion 310 is arranged inside the reaction chamber 320.

Figure 25:
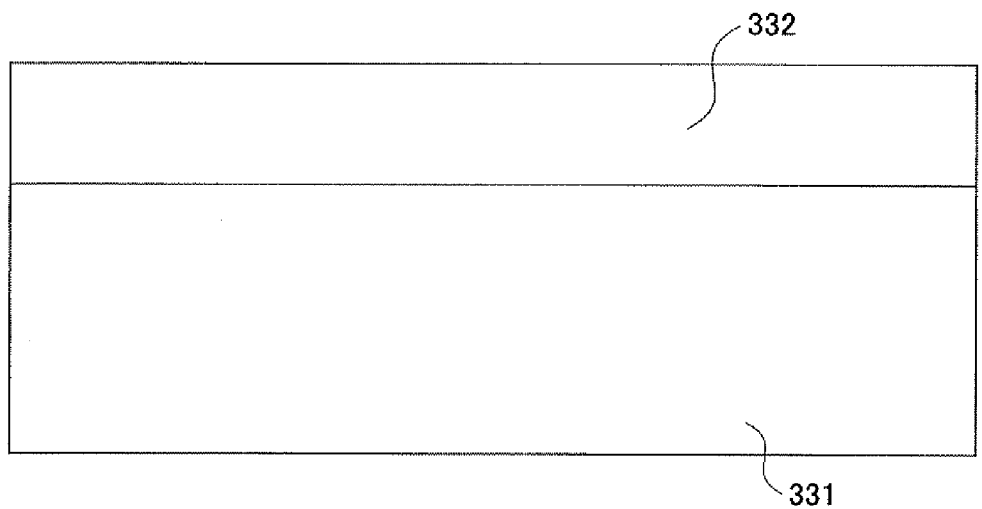
FIG. 25 is a configuration diagram of a sample to be processed by an organic substance removal method according to the second embodiment (Part 1).

A sample subject to the organic substance removal method may be prepared, for example, by applying a positive type photoresist that is sensitive to exposure light having a wavelength of KrF on a Si substrate 331, as shown in FIG. 25, and ion-implanting arsenic to a positive type photoresist film 332 at an acceleration voltage of 60 keV and at a dose amount of $5 \times 10^{15}$ cm$^{-2}$.

After the sample is held by the substrate holder 321 inside the chamber 320 and the chamber 320 is evacuated to a reduced pressure, the mixed gas of the H₂ gas and the O₂ gas is introduced at room temperature to the gas inlet 313 of the catalytic reaction portion 310. At this time, a total flow rate of the mixed gas of the H₂ gas and the O₂ gas is 100 sccm, and a flow rate ratio is H₂:O₂=2:1. In addition, a pressure inside the chamber 320 may be adjusted at about 10 Torr.

In the above conditions, the positive photoresist film 332 on the Si substrate 331 is removed.

Figure 26:
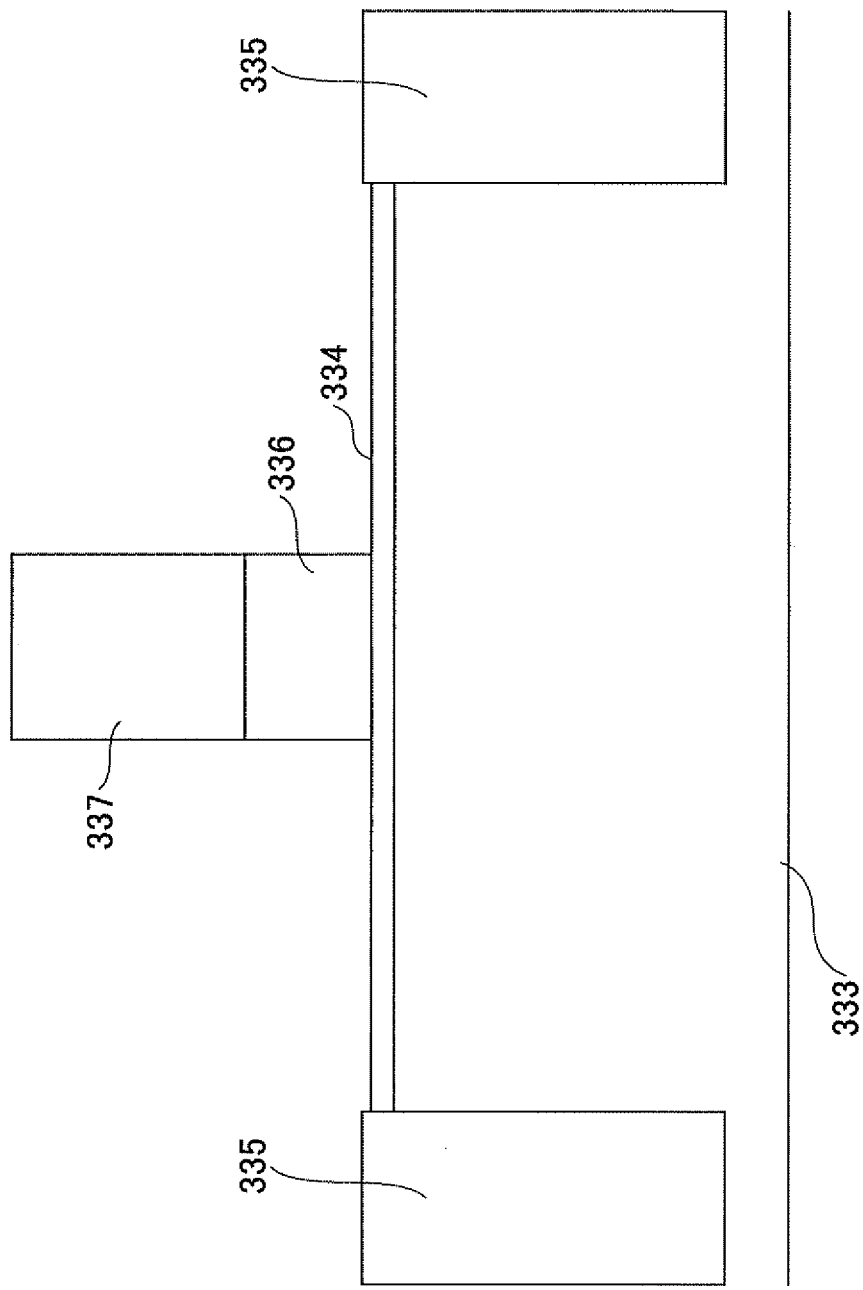
FIG. 26 is a configuration diagram of a sample to be processed by an organic substance removal method according to the second embodiment (Part 2).

In addition, a sample shown in FIG. 26 is made and an organic substance is removed in a similar manner as the above. Specifically, a gate oxide film 334 composed of SiO₂ 6 nm thick and an isolation area 335 composed of SiO₂ are formed, and a poly-crystalline silicon film 336 having a thickness of 100 nm is deposited by a reduced pressure CVD method using SiH4 gas at a substrate temperature of 600° C. A photoresist is applied on the poly-crystalline silicon film 336, pre-baked, exposed to an exposure light in an exposure apparatus, and developed, thereby forming a photoresist pattern 337. Then, a portion of the poly-crystalline silicon film 336 where the photoresist pattern 337 is not formed is removed by a dry-etching method using $Cl_2$ and HBr gases. With this, the sample shown in FIG. 26 is obtained.

This sample is held by the substrate holder 321 inside the chamber 320, and the photoresist pattern 337 is removed in a similar method as the above.

The organic substance removal method according to this embodiment can keep down production and apparatus costs, without using a corrosive gas or the like, and additionally does not incur plasma damage onto the substrate or the like.

(Silicon Film Property Alteration Method)

Figure 27:
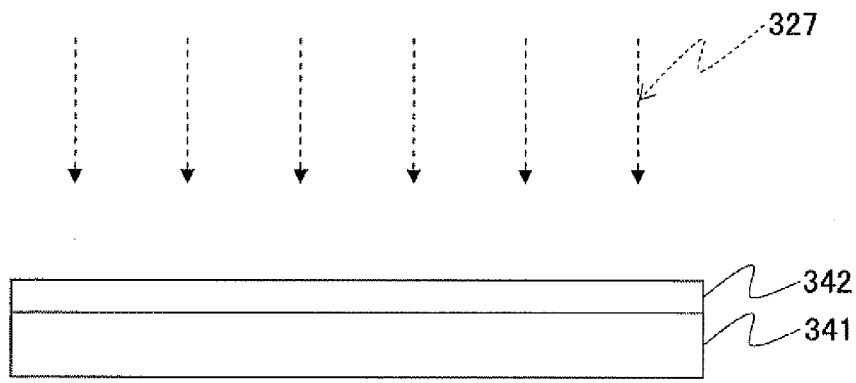
FIG. 27 is an explanatory view of a silicon film property alteration method according to the second embodiment.

Next, a film property alteration method of a silicon film made of poly-crystalline silicon, amorphous silicon, micro crystalline silicon, or the like, which is one kind of substrate processing method according to this embodiment, is explained with reference to FIG. 27. A film thickness of the silicon film may be, for example, 0.01 through 10 μm.

This silicon film property alteration method can reduce a defect density in a poly-crystalline film 342 by ejecting high temperature $H_2O$ gas 327 onto a substrate 341 with the poly crystalline film 342 formed thereon at relatively low temperatures and/or low vacuums. Specifically, dangling bonds at silicon grain boundaries in the poly crystalline film 342 deposited by a sputtering method, a CVD method, or the like, are terminated, thereby inactivating the crystalline defects and thus improving a Hall mobility.

In an apparatus to be used for the silicon film property alteration method, the substrate 341 on which the poly crystalline film 342 is deposited is held by the substrate holder 321, and the high temperature $H_2O$ gas 327 is ejected from the catalyst reaction portion 310 to the poly crystalline film 342, thereby altering the film property of the poly crystalline film 342.

According to the silicon film property alteration method, which is one kind of substrate processing method according to this embodiment, the film property alteration can be realized in the silicon film formed on a substrate having a relatively low melting point because there is no need for heating the entire substrate 341.

(Oxide Film Property Alteration Method and Apparatus)

Next, an oxide film property alteration method, which is one kind of substrate processing method according to this embodiment, is explained. This method enables formation of an oxide film in accordance with its stoichiometric proportion by supplying oxygen to the oxide film with oxygen defects. The oxide film may be a transparent electrically conductive film such as zinc oxide and indium tin oxide (ITO), a semiconductor film such as indium gallium zinc oxide (IGZO), and a dielectric film such as hafnium oxide and tantalum oxide.

Figure 28:
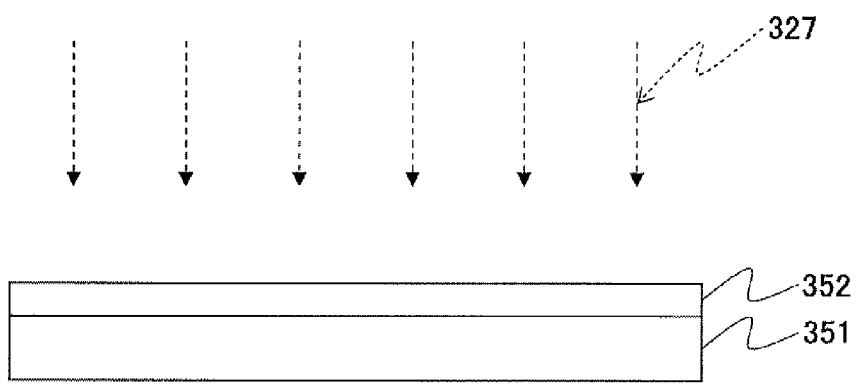
FIG. 28 is an explanatory view of an oxide film property alteration method according to the second embodiment.

In this oxide film property alteration method, a high temperature $H_2O$ gas 327 is ejected to a substrate 351 (FIG. 28) on which an oxide film 352 with oxygen defects is formed, thereby converting the oxide film with oxygen defects to an oxide film in accordance with its stoichiometric proportion, using the apparatus shown in FIG. 23 and FIG. 24. With this, a desired property can be obtained for such as the transparent electrically conductive film, the semiconductor film, and the dielectric film.

Specifically, the substrate 351 on which the oxide film 352 with oxygen defects is formed is held by the substrate holder 321 inside the chamber 320, and the high temperature $H_2O$ gas 327 is ejected to the surface of the oxide film 352 with oxygen defects from the catalyst reaction portion 310, so that oxygen defects are compensated for and the film property is improved.

According to the oxide film property alteration method, which is one kind of substrate processing method according to this embodiment, oxygen defects in the oxide film with oxygen defects can be compensated for with a simplified apparatus.

(Oxide Film Property Alteration Method and Apparatus)

Next, an oxide film forming method that forms an oxide film on a surface of a Si substrate is explained, which is one kind of substrate processing method according to this embodiment.

Figure 29A:
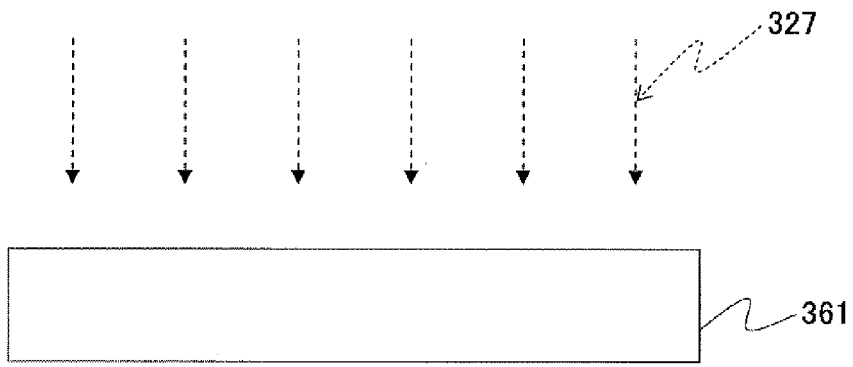
FIG. 29A is an explanatory view of an oxide film forming method according to the second embodiment.
Figure 29B:
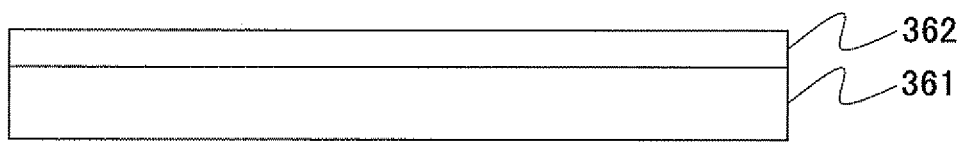
FIG. 29B is an explanatory view of an oxide film forming method according to the second embodiment.

In this oxide film forming method, by ejecting the high temperature $H_2O$ gas 327 to a surface of a Si substrate 361 shown in FIG. 29A under conditions of higher temperature and higher vacuum than those in the silicon film property alteration method, Si on the Si substrate 361 reacts with O included in the high temperature $H_2O$ gas, thereby forming a $SiO_2$ film 362 as an oxide film on the surface of the Si substrate 361 (FIG. 29B).

Specifically, the Si substrate 361 is held by the substrate holder 321 inside the chamber 320, and the high temperature $H_2O$ gas 327 is ejected to the surface of the Si substrate 361 from the catalyst reaction portion 310, so that the $SiO_2$ film as the oxide film is formed on the surface of the Si substrate 361.

Altered Example 1

Next, a substrate processing method according to an altered example 1 of the second embodiment is explained. The substrate processing method of the altered example 1 is preferably carried out in an apparatus that has a catalyst reaction portion to which the $H_2$ gas and the $O_2$ gas are separately supplied.

An apparatus to be used in the substrate processing method of this altered example is shown in FIG. 30. A catalyst reaction portion 410 in this apparatus includes a cylindrical catalyst container jacket 411 made of metal such as stainless steel, a catalyst reaction container 415 that is made of materials such as ceramic materials or metals and accommodated in the catalyst container jacket 411, and an ejection hole 414 attached at one end of the catalyst container jacket 411. A catalyst 412 obtained by causing carriers in the form of microparticles to carry catalyst components in the form of ultramicroparticles is arranged inside the catalyst reaction portion 410, and a metal mesh 416 is provided to hold the catalyst 412. In addition, an $H_2$ gas inlet 403 and an $O_2$ gas inlet 413 that are connected to the catalyst reaction portion 410 are connected to a $H_2$ gas supplying portion and an $O_2$ gas supplying portion (not shown) via control valves 433, 443, respectively. Opening/closing the control valves 433 and 443 and flow rates are controlled by a control portion 468.

The $H_2$ gas and the $O_2$ gas are introduced into the catalyst reaction portion 410 from the $H_2$ gas inlet 403 and the $O_2$ gas inlet 413, respectively. With this, a chemical combination reaction of the $H_2$ gas and the $O_2$ gas takes place with the catalyst 412 in the form of microparticles. This reaction is accompanied with a large amount of heat, and a high temperature $H_2O$ gas 427 heated by the reaction heat is vigorously ejected toward the substrate 422 held by a substrate holder (not shown) from the reaction gas ejection hole 414. The ejected $H_2O$ gas can be used in the organic substance removal method, the silicon film property alteration method, the oxide film property alteration method, the oxide film forming method, or the like.

Incidentally, FIG. 30 corresponds to FIG. 24, and the catalyst reaction portion 410 and the substrate 422 are accommodated in a chamber (not shown) that is connected to a predetermined evacuation apparatus (not shown) and thus is evacuatable to reduced pressures.

Altered Example 2

Next, a substrate processing method according to an altered example 2 of the second embodiment is explained. The substrate processing method according to the altered example 2 can be preferably carried out in an apparatus having plural catalyst reaction portions.

As shown in FIG. 31, an apparatus to be used in this altered example is provided with plural catalyst reaction containers 511 serving as catalyst reaction portions in order to carry out the substrate processing with respect to a large-area substrate or the like. A catalyst 512 is arranged in each of the catalyst reaction containers 511, to which the mixed gas of the $H_2$ gas and the $O_2$ gas is supplied from corresponding gas inlets 513. Due to the mixed gas of the $H_2$ gas and the $O_2$ gas introduced from the gas inlets 513, a chemical reaction accompanied with a large amount of heat takes place in the catalysts 512 in the corresponding catalyst reaction containers 511, thereby producing the high temperature $H_2O$ gas. In addition, ejection holes 514 are provided on the other sides of the corresponding catalyst reaction containers 511 across from the corresponding gas inlets 513 with respect to the corresponding catalysts 512. The high temperature $H_2O$ gas produced by the catalysts 512 is vigorously ejected from the ejection holes 514. The ejection holes 514 have a funnel shape, namely a shape whose aperture becomes larger toward the distal end thereof. Incidentally, in the chamber 520, a substrate 522 is arranged on a stage 521, and the $H_2O$ gas is ejected toward the substrate 522. In addition, the chamber 520 is evacuated by a vacuum pump (not shown) through the evacuation opening 523, as shown by an arrow a.

As easily understood by comparing FIG. 1 and FIG. 31, the film deposition apparatus of FIG. 1 can be configured by providing, between the catalyst reaction containers 11, the deposition gas inlets 16 that introduce the deposition gas that reacts with the reaction gas from the catalyst reaction container 511 and the deposition gas nozzles 15 that supply the deposition gas into a space in the chamber, with respect to the substrate processing apparatus of FIG. 31.

The apparatus to be used in the substrate processing method of this altered example is provided with funnel-shaped selection walls 517 that are open at the distal ends, so that high temperature $H_2O$ gas having high energy, which is part of the high temperature $H_2O$ gas ejected from the ejection holes 14, is supplied into the chamber 520. The high temperature $H_2O$ gas is selected and supplied from openings 518 of the corresponding selection walls 517.

The high temperature $H_2O$ gas having low energy that has been filtered out by the selection walls 517 is evacuated in a direction indicated by an arrow b through an evacuation port 524 provided on a side wall of the catalyst reaction container 511 by a vacuum pump (not shown).

The apparatus used in the substrate processing method according to this altered example can be used not only in an oxide film forming method but also substrate processing methods according to other embodiments of the present invention, and can process a large-area substrate.

Altered Example 3

Next, a substrate processing method according to an altered example 3 of the second embodiment is explained. The substrate processing method of the altered example 3 can be preferably carried out in an apparatus having plural catalyst reaction portions. The apparatus to be used for the substrate processing method is explained with respect to FIG. 32.

Figure 32:
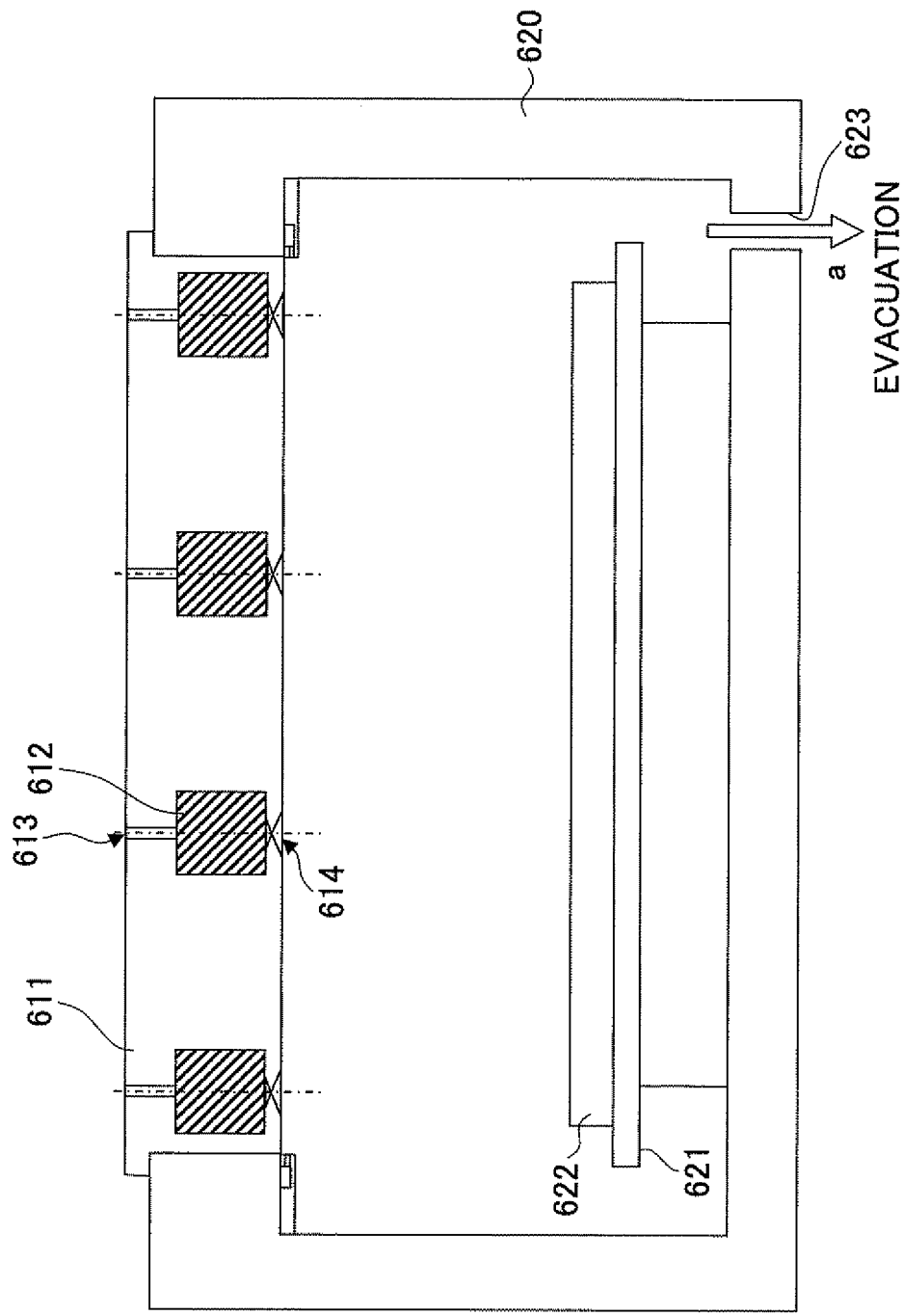
FIG. 32 is a configuration diagram of a substrate processing apparatus to be used in an altered example 3 according to the second embodiment.

An apparatus shown in FIG. 32 can process a large-area substrate or the like, and is provided with plural catalysts 612 in a catalyst reaction container 611 serving as a catalyst reaction portion. A mixed gas of the $H_2$ gas and the $O_2$ gas is supplied from gas inlets 613 to the corresponding catalysts 612. With the mixed gas of the $H_2$ gas and the $O_2$ gas that has been introduced from the gas inlets 613, a chemical reaction accompanied with a large amount of heat takes place in the catalysts 612 to thereby produce high temperature $H_2O$ gas. In addition, ejection holes 614 are provided on the other side across from the corresponding gas inlets 613 with respect to the corresponding catalysts 612, and the high temperature $H_2O$ gas produced by the catalyst 612 is vigorously ejected from the ejection holes 614 to the inside of the chamber 620. Each of the ejection holes 614 has a funnel shape, namely a shape whose aperture becomes larger in the direction along which the $H_2O$ gas is ejected. In the chamber 620, a substrate 622 is arranged on a stage 621, and the $H_2O$ gas is ejected toward the substrate 622. Incidentally, the chamber 620 is evacuated by a vacuum pump (not shown) through the evacuation opening 623, as shown by an arrow a.

Next, other apparatuses to be used for the substrate processing method of this altered example are explained.

Figure 33:
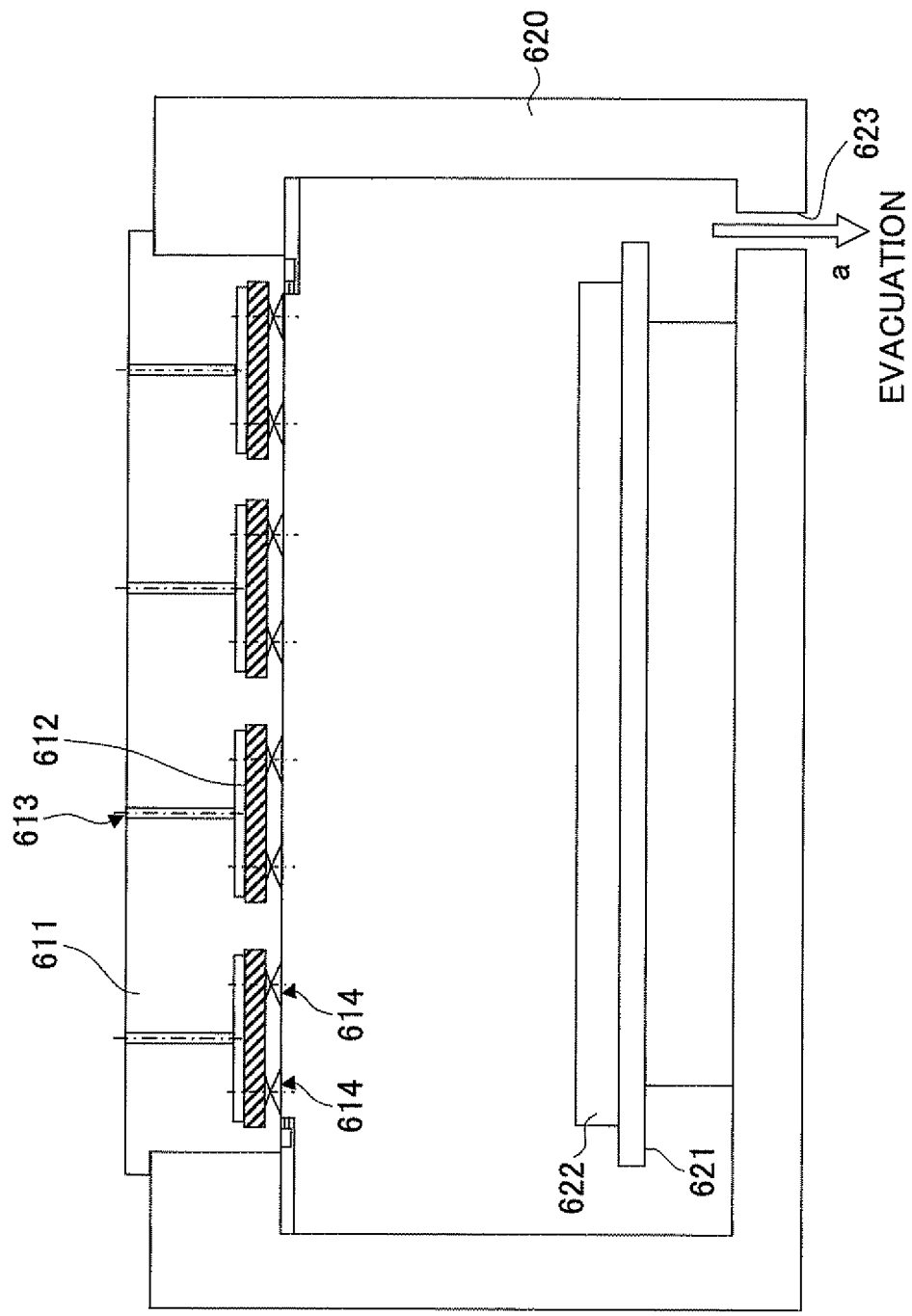
FIG. 33 is a configuration diagram of another substrate processing apparatus to be used in an altered example 3 according to the second embodiment (Part 1).

An apparatus shown in FIG. 33 includes plural catalysts 612, and plural ejection holes 614 provided corresponding to the catalysts 612 in order to eject the $H_2O$ gas from the catalysts 612 into a chamber 620. Because the plural ejection holes 614 are provided, further uniform processing can be realized.

Figure 34:
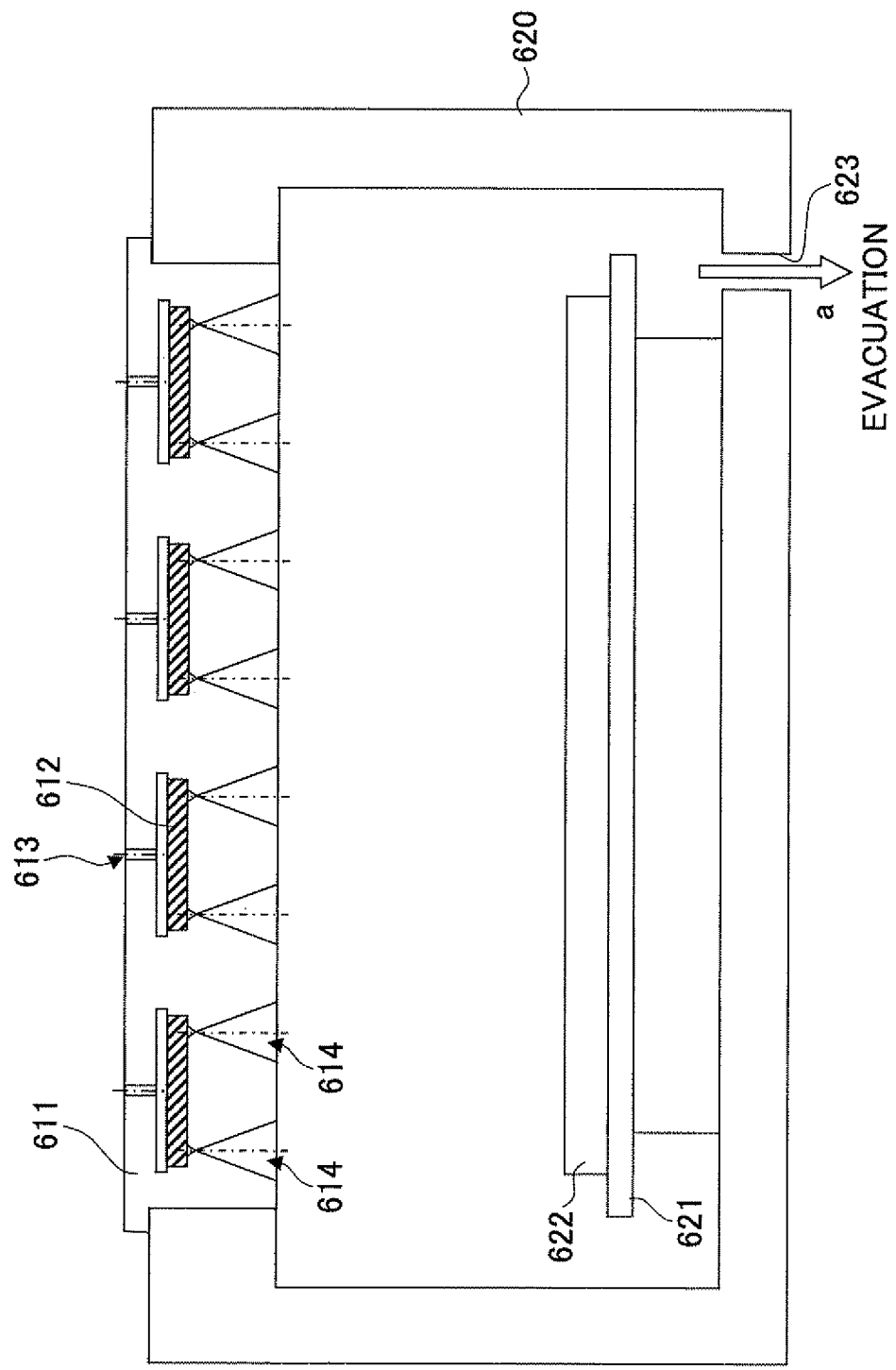
FIG. 34 is a configuration diagram of another substrate processing apparatus to be used in an altered example 3 according to the second embodiment (Part 2).

In addition, an apparatus shown in FIG. 34 includes the plural catalysts 612, and plural ejection holes 614 provided corresponding to the catalysts 612 in order to eject the $H_2O$ gas from the catalysts 612 into a chamber 620. These ejection holes 614 are larger than the ejection holes in the film deposition apparatus shown in FIG. 33.

Figure 35:
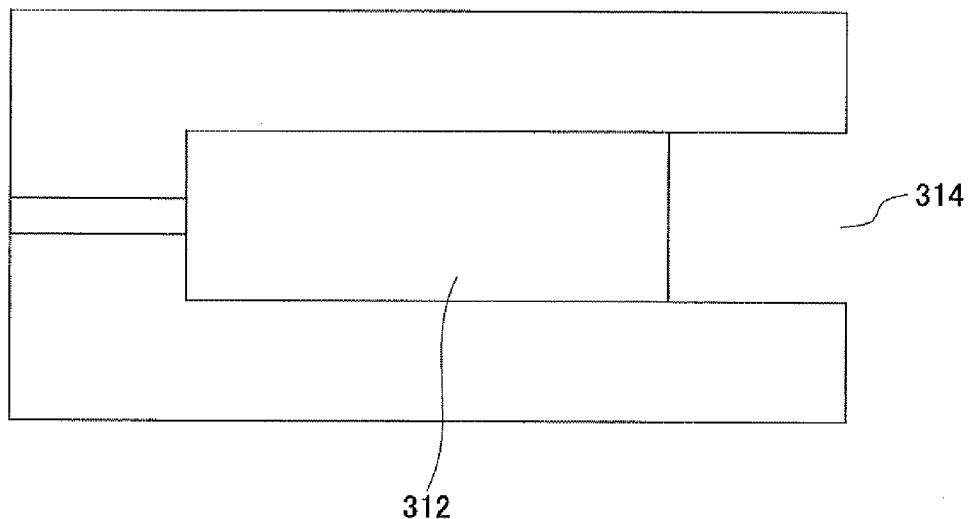
FIG. 35 is an outline diagram of an ejection portion in the substrate processing apparatus shown in FIG. 23.

Here, advantages and effects based on a shape of the ejection holes are explained with reference to FIG. 35 and FIG. 36. FIG. 35 illustrates the ejection holes 314 in the apparatus explained with reference to FIG. 23, and FIG. 36 illustrates the ejection holes 614 in the apparatus shown in FIG. 33 and FIG. 34 to be used for the substrate processing method of this altered example.

Figure 36:
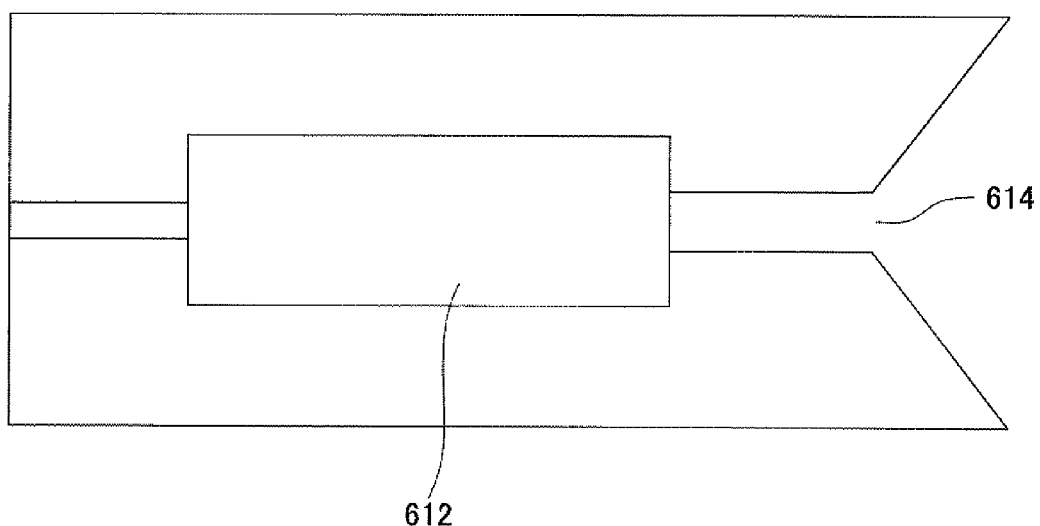
FIG. 36 is an outline diagram of an ejection portion in the substrate processing apparatus according to the altered example 3 of the second embodiment.

The $H_2O$ gas having higher thermal energy is ejected at a lower speed from the ejection hole 314 shown in FIG. 35, and the $H_2O$ gas having lower thermal energy is ejected at a higher speed from the ejection hole 614 shown in FIG. 36. Namely, with the shape of the ejection hole 614 shown in FIG. 36, the thermal energy of the ejected $H_2O$ gas can be converted into translational kinetic energy, so that the speed of the ejected gas can be increased.

With this, collision energy of precursors onto the surface of the substrate can be increased. In addition, a partial pressure of the precursors on the surface of the substrate can be relatively increased. Moreover, because when molecules having high thermal energy bombard the substrate the molecules tend to be desorbed, surface adhesion can be facilitated by reducing the thermal energy. In addition, precursors in the form of clusters can bombard the substrate by increasing the translational kinetic energy. Therefore, by selecting an appropriate shape of the ejection hole in accordance with the substrate processing, an appropriate substrate processing can be carried out. Moreover, by selecting a configuration including the selection walls from the above configurations, further appropriate substrate processing can be carried out.

The apparatus used in the substrate processing method according to this altered example can be used not only in an oxide film forming method but also substrate processing methods according to other embodiments of the present invention, and can process a large-area substrate.

Altered Example 4

Next, a substrate processing method according to an altered example 4 of the second embodiment is explained. In the substrate processing method of the altered example 4, especially the $H_2$ gas and the $O_2$ gas is intermittently supplied. This substrate processing method is based on the principle explained with reference to FIG. 17. The substrate processing method is specifically carried out in the film deposition apparatus shown in FIG. 30, and the $O_2$ gas and the $H_2$ gas are introduced at a timing shown in FIG. 37.

Figure 37:
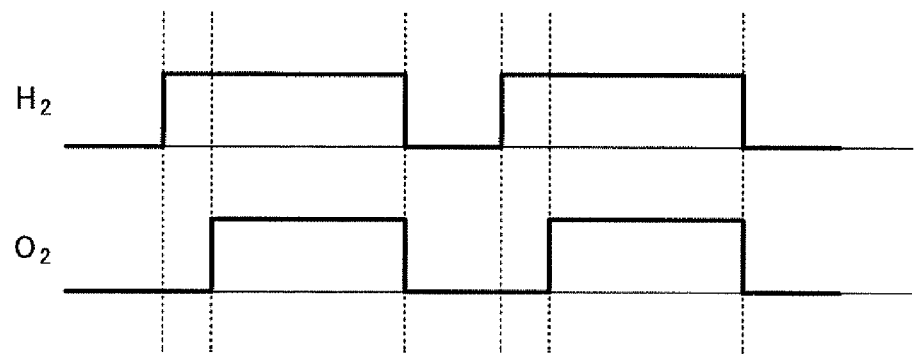
FIG. 37 is a timing chart of a process to be used in the altered example 4 of the second embodiment.
Figure 38:
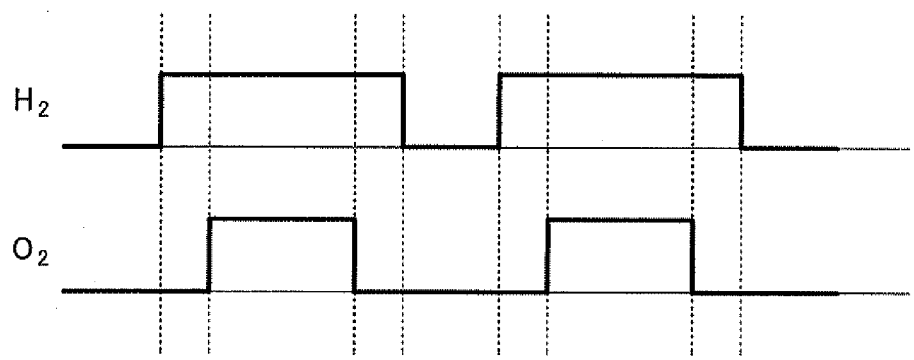
FIG. 38 is a timing chart of another process to be used in the altered example 4 of the second embodiment (Part 1).

As shown in FIG. 37, first, the $H_2$ gas is introduced and then, the $O_2$ gas is introduced. With this, the high temperature $H_2O$ gas is produced in the catalyst reaction portion 410. Subsequently, the supply of the $H_2$ gas and the $O_2$ gas is terminated. Next, these procedures are repeated. With this, the high temperature $H_2O$ gas 427 produced by the catalyst 412 (FIG. 30) is ejected toward the substrate 422

In this process, because the supply of the $O_2$ gas is terminated (in other words, a flow rate of the $O_2$ gas is reduced to 0 sccm), the O atoms adhered on the surface of the catalyst 412 are desorbed from the surface of the catalyst 412, and the H atoms are easily adhered on the surface of the catalyst 412. With this, the high temperature $H_2O$ gas 427 is efficiently produced.

More preferably, first, the $H_2$ gas is introduced, and next, the $O_2$ gas is introduced. Then, the supply of the $O_2$ gas is terminated, and next, the supply of the $H_2$ gas is terminated. In such a manner, by terminating the supply of the $H_2$ gas at the end, the adsorption of the O atoms on the surface of the catalyst Pt can be further prevented, thereby more efficiently producing the high temperature $H_2O$ gas 427.

The above intermittent supply of the gases is repeated preferably at a frequency of 1 Hz through 1 kHz. In the case of 1 Hz or less, there is a problem in that production efficiency is reduced, and in the case of 1 kHz or more, it becomes difficult to obtain an excellent film property.

In addition, in the film deposition method according to this altered example, the same effects are obtained by controlling the $O_2$ gas while the $H_2$ gas is kept flowing. Moreover, the same effects are obtained by changing a partial pressure of the $H_2$ gas and the $O_2$ gas. Specifically, it is preferable that the partial pressure of the $O_2$ gas is reduced thereby facilitating adhesion of the H atoms on the surface of the catalyst 12 in a time period during which the deposition gas is not supplied, and then the partial pressure of the $O_2$ gas is increased again. Incidentally, a flow rate of the $H_2$ gas may be increased in order to reduce the partial pressure of the $O_2$ gas.

Figure 39:
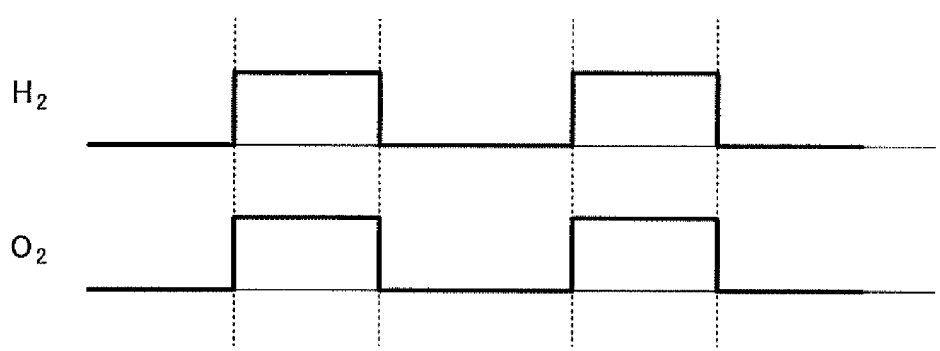
FIG. 39 is a timing chart of another process to be used in the altered example 4 of the second embodiment (Part 2).

In addition, because the substrate processing method has effects of preventing the catalyst reaction from being impeded, the effects being caused by supplying the $O_2$ gas earlier than the $H_2$ gas, the effects can be obtained when the $H_2$ gas and the $O_2$ gas are supplied substantially at the same time as shown in FIG. 39. Moreover, the same effects can be obtained when a total pressure is changed while keeping a constant partial pressure of the $H_2$ gas and the $O_2$ gas.

Incidentally, when the $H_2$ gas and the $O_2$ gas are supplied at a constant total pressure and a constant partial pressure, the high temperature $H_2O$ gas can be produced. But it is preferable to intermittently supply the $O_2$ gas from a viewpoint of production efficiency of the high temperature $H_2O$ gas.

In this altered example, the intermittent supply of a gas includes not only a case where a time period during which the gas is supplied and a time period during which the gas is not supplied (or supplied at a flow rate of 0 sccm) are alternately repeated, but also a case where a time period during which the gas is supplied at a predetermined flow rate and a time period during which the gas is supplied at a flow rate smaller than the predetermined flow rate are alternately repeated.

The substrate processing method according to this altered example is applicable to the above substrate processing methods.

The intermittent supply of the gases is applicable to not only this altered example but also substrate processing methods according to other embodiments.

Although the present invention has been explained with reference to the above embodiments, the present invention is not limited to the disclosed embodiments, but may be altered or modified within the scope of the accompanying Claims.

This international patent application claims priority based on Japanese Patent Application No. 2008-297906, filed on Nov. 21, 2008, the entire contents of which are hereby incorporated herein by reference.

The invention claimed is:

1. A substrate processing method of processing a substrate, the method comprising steps of:
   arranging a substrate in a chamber;
   introducing $H_2$ gas at a first flow rate and $O_2$ gas at a second flow rate independently from the $H_2$ gas into a catalyst reaction portion in which a catalyst is accommodated, wherein $H_2O$ gas produced from the $H_2$ gas and the $O_2$ gas that contact the catalyst is ejected from the catalyst reaction portion toward the substrate; and
   reducing a flow rate of the $O_2$ gas introduced to the catalyst reaction portion to a third flow rate that is lower than the second flow rate,
   wherein the steps of introducing the $H_2$ gas and the $O_2$ gas and reducing the flow rate of the $O_2$ gas are repeated in this order at a predetermined repetition frequency, thereby processing the substrate.

2. The substrate processing method of claim 1, further comprising a step of supplying a film deposition gas including a constituent element of an oxide film into the chamber for a predetermined period of time,
   wherein repetition at the predetermined repetition frequency is carried out in the order of the steps of introducing the $H_2$ gas and the $O_2$ gas, supplying the film deposition gas, and reducing the flow rate of the $O_2$ gas.

3. The substrate processing method of claim 2, wherein the third flow rate in the step of reducing the flow rate of the $O_2$ gas is 0 sccm.

4. The substrate processing method of claim 2, further comprising a step of reducing a flow rate of the $H_2$ gas introduced to the catalyst reaction portion to a fourth flow rate that is lower than the first flow rate.

5. The substrate processing method of claim 4, wherein the third flow rate in the step of reducing the flow rate of the $O_2$ gas is 0 sccm, and
   wherein the fourth flow rate in the step of reducing the flow rate of the $H_2$ gas is 0 sccm.

6. The substrate processing method of claim 5, wherein the step of reducing the flow rate of the $H_2$ gas is carried out after the step of reducing the flow rate of the $O_2$ gas.

7. The substrate processing method of claim 2, wherein the step of introducing the $H_2$ gas and the $O_2$ gas includes a step of setting a partial pressure of the $O_2$ gas in the catalyst reaction portion to a first partial pressure, and
wherein the step of reducing the flow rate of the $O_2$ gas includes a step of setting a partial pressure of the $O_2$ gas in the catalyst reaction portion to a second partial pressure that is lower than the first partial pressure.

8. The substrate processing method of claim 2, wherein the $H_2$ gas is introduced into the catalyst reaction portion earlier than the $O_2$ gas in the step of introducing the $H_2$ gas and the $O_2$ gas.

9. The substrate processing method of claim 2, wherein the predetermined repetition frequency is in a range from 1 Hz through 1 kHz.

10. The substrate processing method of claim 2, wherein the predetermined period of time is 1 second or less.

11. The substrate processing method of claim 1, further comprising:
a step of reducing a flow rate of the $H_2$ gas introduced to the catalyst reaction portion to a fourth flow rate that is lower than the first flow rate; and
a step of supplying a film deposition gas including a constituent element of an oxide film into the chamber for a predetermined period of time,
wherein the step of supplying the film deposition gas is carried out after the step of introducing the $H_2$ gas and the $O_2$ gas is started and after the steps of reducing the flow rate of the $O_2$ gas and reducing the flow rate of the $H_2$ gas, and
wherein the repetition at the predetermined repetition frequency is carried out in the order of the step of introducing the $H_2$ gas and the $O_2$, the steps of reducing the flow rate of the $O_2$ gas and reducing the flow rate of the $H_2$ gas, and the step of supplying the film deposition gas.

12. The substrate processing method of claim 1, wherein the third flow rate in the step of reducing the flow rate of the $O_2$ gas is 0 sccm.

13. The substrate processing method of claim 1, further comprising a step of reducing a flow rate of the $H_2$ gas introduced to the catalyst reaction portion to a fourth flow rate that is lower than the first flow rate.

14. The substrate processing method of claim 13, wherein the third flow rate in the step of reducing the flow rate of the $O_2$ gas is 0 sccm, and
wherein the fourth flow rate in the step of reducing the flow rate of the $H_2$ gas is 0 sccm.

15. The substrate processing method of claim 14, wherein the step of reducing the flow rate of the $H_2$ gas is carried out after the step of reducing the flow rate of the $O_2$ gas.

16. The substrate processing method of claim 1, wherein the step of introducing the $H_2$ gas and the $O_2$ gas includes a step of setting a partial pressure of the $O_2$ gas in the catalyst reaction portion to a first partial pressure, and
wherein the step of reducing the flow rate of the $O_2$ gas includes a step of setting a partial pressure of the $O_2$ gas in the catalyst reaction portion to a second partial pressure that is lower than the first partial pressure.

17. The substrate processing method of claim 1, wherein the $H_2$ gas is introduced into the catalyst reaction portion earlier than the $O_2$ gas in the step of introducing the $H_2$ gas and the $O_2$ gas.

18. The substrate processing method of claim 1, wherein the predetermined repetition frequency is in a range from 1 Hz through 1 kHz.

* * * * *